(12) United States Patent
Noble

(10) Patent No.: US 6,190,960 B1
(45) Date of Patent: Feb. 20, 2001

(54) METHOD FOR COUPLING TO SEMICONDUCTOR DEVICE IN AN INTEGRATED CIRCUIT HAVING EDGE-DEFINED SUB-LITHOGRAPHIC CONDUCTORS

(75) Inventor: Wendell P. Noble, Milton, VT (US)

(73) Assignee: Micron Technology, Inc., Boise, ID (US)

( * ) Notice: Under 35 U.S.C. 154(b), the term of this patent shall be extended for 0 days.

(21) Appl. No.: 08/842,950

(22) Filed: Apr. 25, 1997

(51) Int. Cl.$^7$ .............................................. H01L 21/8242
(52) U.S. Cl. ......................... 438/253; 438/396; 438/947
(58) Field of Search .................................. 438/241, 253, 438/396, 672, 675, 947, 239, 381

(56) References Cited

U.S. PATENT DOCUMENTS

| 4,604,162 | 8/1986 | Sobczak | 156/657 |
| 5,214,603 | 5/1993 | Dhong et al. | 365/207 |
| 5,391,911 | 2/1995 | Beyer et al. | 257/522 |
| 5,510,286 | * 4/1996 | Kim | 438/947 |
| 5,539,229 | 7/1996 | Noble et al. | 257/301 |
| 5,753,527 | * 5/1998 | Itoh et al. | 438/241 |
| 5,976,930 | * 11/1999 | Noble | 438/253 |

FOREIGN PATENT DOCUMENTS

| 0720221 | 7/1996 | (EP) | H01L/21/8242 |

OTHER PUBLICATIONS

Bakeman, P., et al., "A High Performance 16-Mb DRAM Technology", 1990 Symposium on VLSI Technology, Digest of Technical Papers, Honolulu, Hawaii, 11–12, (Jun. 4–7, 1990).

Davari, B., et al., "A Variable–Size Shallow Trench Isolation (STI) Technology with Diffused Sidewall Doping for Submicron CMOS", *iedm Technical Digest*, International Electron Devices Meeting, San Francisco, CA, 92–95, (Dec. 11–14, 1988).

Kohyama, Y., et al., "Buried Bit–Lined Cell for 64MB DRAMs", 1990 Symposium on VLSI Technology, Digest of Technical Papers, Honolulu, HI, 17–18, (Jun. 4–7, 1990).

Kuge, S., et al., "SOI–DRAM Circuit Technologies for Low Power High Speed Multigiga Scale Memories", *IEEE Journal of Solid–State Ciruits, 31*, 586–591, (Apr., 1996).

Suma, K., et al., "An SOI–DRAM with Wide Operating Voltage Range by CMOS/SIMOX Technology", *IEEE Journal of Solid–State Circuits, 29*, 1323–1329, (Nov. 1994).

\* cited by examiner

*Primary Examiner*—Carl Whitehead, Jr.
*Assistant Examiner*—Toniae M. Thomas
(74) *Attorney, Agent, or Firm*—Schwegman, Lundberg, Woessner & Kluth, P.A.

(57) ABSTRACT

An integrated circuit comprising stacked capacitor memory cells having sub-lithographic, edge-defined word lines and a method for forming such an integrated circuit. The method forms conductors adjacent to sub-lithographic word lines in order to couple a stacked capacitor to the access transistor of the memory cell. The conductors are bounded by the word lines. The bit line and capacitor are formed with a single mask image in such a manner as to self-align the bit line and the capacitor and to maximize the capacitance of the memory device. The method may be used to couple any suitable circuit element to a semiconductor device in an integrated circuit having edge-defined, sub-lithographic word lines.

10 Claims, 21 Drawing Sheets

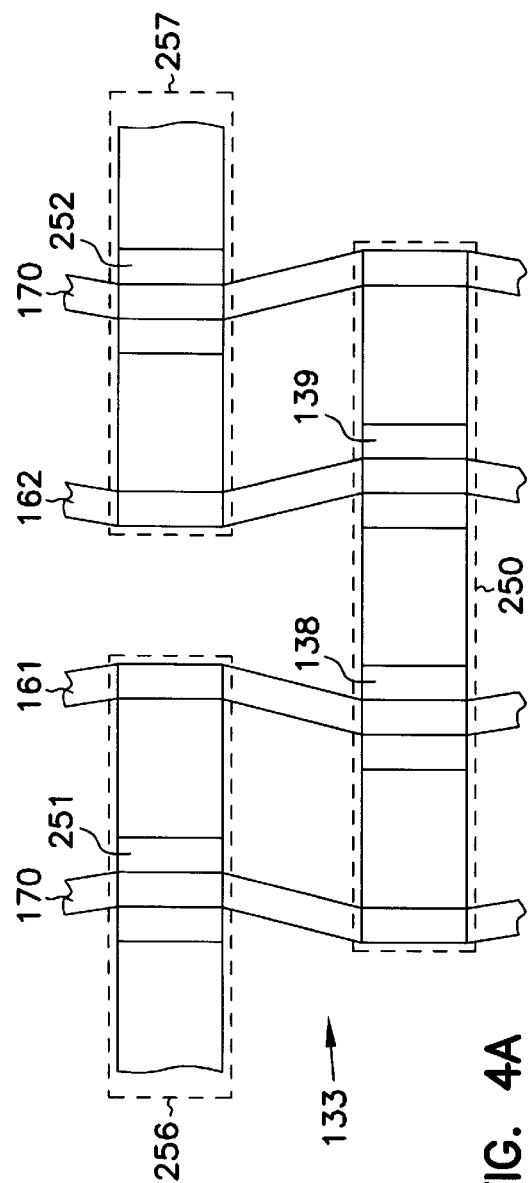
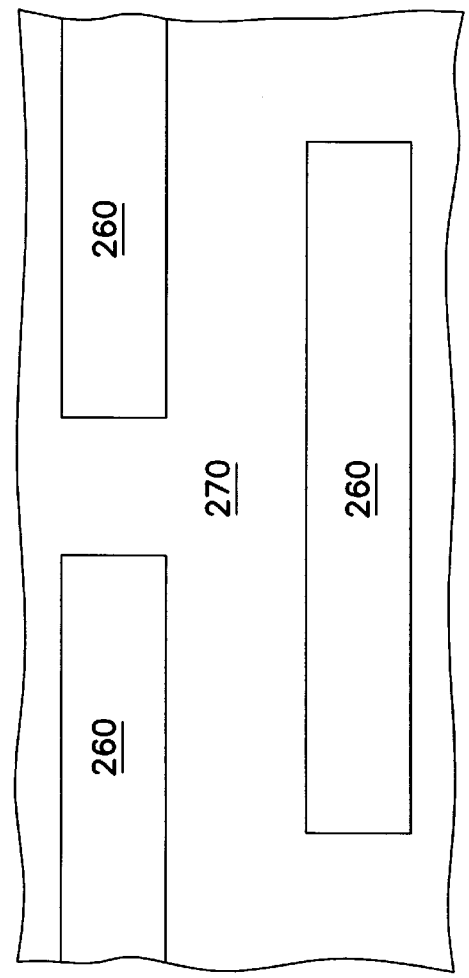
FIG. 4A
FIG. 4B

METHOD FOR COUPLING TO SEMICONDUCTOR DEVICE IN AN INTEGRATED CIRCUIT HAVING EDGE-DEFINED SUB-LITHOGRAPHIC CONDUCTORS

CROSS REFERENCE TO RELATED CASES

This application is related to co-pending, commonly assigned U.S. patent application Ser. No. 08/842,971 and U.S. patent application Ser. No. 08/845,609.

FIELD OF THE INVENTION

This invention pertains to the field of semiconductor devices, and in particular, pertains to a method for coupling to a semiconductor device in an integrated circuit having edge-defined, sub-lithographic conductors.

BACKGROUND OF THE INVENTION

Manufacturers of semiconductor memory devices continually strive to reduce the size of individual memory cells. By reducing the size of individual memory cells, faster and higher capacity memory devices can be constructed. Conventional memory cells typically comprise a substrate, a transistor formed in the substrate, a storage capacitor coupled to the transistor, and a word line and a bit line for accessing the memory cell. One limiting factor in reducing the size of the memory cell is the size of the access lines of the memory device. In order to resolve this limitation, manufacturers have developed memory devices with word line conductors that extend normal to the substrate. Furthermore, the word lines are narrower than the gate regions of the transistors to which they are coupled. This type of word line is known in the art as an edge-defined word line.

The typical fabrication process of semiconductor memory device comprises a series of lithographic steps where material is either deposited on the device or removed from the device. The minimum dimension of the material which can be deposited or removed is known in the art as the minimum lithographic dimension. In a further attempt to reduce the size of a memory cell, manufacturers have developed word lines which are narrower than the minimum lithographic dimension. The development of sub-lithographic word lines which extend normal to the surface of the substrate has eliminated the size of a word line as a limiting factor in the reduction of the memory cell size. The development, however, has introduced complexities in the other areas of the memory cell.

Traditionally, there are two ways of implementing the capacitor region of a memory cell. A memory cell may contain a trench capacitor or a stacked capacitor. A trench capacitor is formed by etching a hole in the substrate. The storage electrode of the trench capacitor is inside the hole and the plate electrode is the substrate. Because a trench capacitor is located in the substrate of the semiconductor device, it is formed before the word lines of the memory device are formed. Thus, with a trench capacitor, the semiconductor manufacturer can easily form edge-defined word lines on top of the substrate and the trench capacitor.

Trench capacitors have several disadvantages. One disadvantage is the difficulty of fabricating them without introducing silicon crystal defects which result in leakage currents from the storage nodes. In contrast, stacked capacitor are formed on top of the cell transistor and therefore do not significantly affect leakage currents within the silicon. Because of their location, however, spacial interference with the cell wiring may limit the fraction of the cell area available for the capacitor.

SUMMARY OF THE INVENTION

For the above reasons, it is advantageous to build the storage capacitor of a memory cell on a plane above that of the wiring and to provide a method to connect the stacked capacitor, located above the sub-lithographic word lines, to the transistor, located, below the sub-lithographic word lines. The present invention allows the active regions of the substrate to be accessed through and above the complex, sub-lithographic word lines so that the active regions can be connected to a semiconductor device, such as a stacked capacitor, which is formed outwardly from the word lines.

One aspect of the invention is a method for forming an integrated circuit using a lithographic process having a minimum lithographic dimension. The method comprises the steps of forming a semiconductor device in a semiconductor substrate, forming a first conductor outwardly from the semiconductor device, the first conductor having a width less than the minimum lithographic dimension, forming a second conductor outwardly from the semiconductor device, the second conductor adjacent to the first conductor, and coupling a circuit component to the semiconductor device by the second conductor.

According to another feature of the invention, the step of coupling a circuit component to the semiconductor comprises the step of coupling a storage capacitor to the semiconductor and the step of forming a semiconductor device comprises the step of forming a transistor for accessing the storage capacitor.

According to another feature of the invention, the step of forming a first conductor comprises the step of forming a word line for activating the transistor.

According to another feature of the invention, the second conductor is aligned with the circuit component by using a single mask image.

According to another feature of the invention, the second conductor is bounded by the first conductor.

Another aspect of the invention is a method for forming a semiconductor memory device using a lithographic process having a minimum lithographic dimension. The method comprising the steps of forming a transistor in a semiconductor substrate, forming a word line outwardly from the transistor, the word line having a width less than the minimum lithographic dimension, the word line for activating the transistor, forming a bit line and a conductor outwardly from the transistor that couple to the transistor, said bit line and said conductor adjacent to the word line, and forming a storage capacitor outwardly from the bit line and the conductor, said storage capacitor coupled to the transistor by the conductor.

Another aspect of the invention is a method for forming two memory cells having a shared bit line using a lithographic process having a minimum lithographic dimension. The method comprising the steps of forming two transistors in a semiconductor substrate, the transistors having a shared drain, each transistor having a gate and a source, the gate extending outwardly from the semiconductor substrate, forming two word lines outwardly from the transistors, each word line having a width less than the minimum lithographic dimension, each word line connected to a gate of a different transistor for activating the transistor, forming a bit line and two conductors outwardly from the transistors that couple to the transistor, the bit line coupled to the shared drain of the transistors, each conductor coupled to a source of a different transistor, the bit line and the conductors adjacent to the word line, and forming two storage capacitors outwardly from the bit line and the conductors, each storage capacitor coupled a source of a different transistor by a different conductor.

Another aspect of the invention is an integrated circuit formed using a lithographic process having a minimum lithographic dimension. The integrated circuit comprising a semiconductor device formed in a semiconductor substrate, a first conductor formed outwardly from the first semiconductor device, the first conductor having a width less than the minimum lithographic dimension, a second conductor formed outwardly from the first semiconductor device, the second conductor adjacent to the first conductor, and a circuit element coupled to the semiconductor device by the second conductor.

Another aspect of the present invention is a memory device formed by a lithographic process having a minimum lithographic dimension. The memory device comprising a plurality of transistors formed in a semiconductor substrate, the transistors having a shared drain, each the transistors having a gate and a source, the gate of each transistor extending outwardly from the semiconductor substrate, a plurality of word lines formed outwardly from the transistors, each word line having a width less than the minimum lithographic dimension, each word line connected to the gate of a different transistor for activating the transistor, a bit line and a plurality of conductors formed outwardly from the transistors, the bit line connected to the shared drain of the transistors, each conductor connected to the source of a different transistor, the bit line and the conductors adjacent to the word lines, and a plurality of storage capacitors formed outwardly from the bit line and the conductors, each storage capacitor coupled a source of a different transistor by a different conductor.

Another aspect of the invention is a pair of memory cells for an integrated memory device formed using a lithographic process having a minimum lithographic dimension. The pair of memory cells comprising two transistors formed in a semiconductor substrate, the transistors having a shared drain, each transistor having a gate and a source, the gate of each transistor extending outwardly from the semiconductor substrate, two word lines formed outwardly from the transistors, each word line having a width less than the minimum lithographic dimension, each word line connected to a gate of a different transistor, the word lines for activating the transistors, a bit line and two conductors formed outwardly from the transistors, the bit line connected to the shared drain of the transistors, each conductor connected to the source of a different transistor, the bit line and the two conductors adjacent to the word line, and two storage capacitors formed outwardly from the bit line and the conductors, each storage capacitor coupled a source of a different transistors by one of the conductors.

BRIEF DESCRIPTION OF THE DRAWING

FIGS. 3 through 17 are cross section and top views of an integrated circuit that illustrate one embodiment of a method for coupling to a semiconductor device in the integrated circuit having sub-lithographic, edge-defined word lines. Specifically, FIGS. 3, 5, 6A, and 7A through 17 are cross-sectional views of the integrated circuit throughout the illustrated embodiment. FIGS. 4A, 4B, and 6B are top views of the integrated circuit throughout the illustrated embodiment.

DETAILED DESCRIPTION OF THE INVENTION

In the following detailed description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Formation of Gate Segments

FIGS. 1A through 1F are perspective views of a portion of an integrated circuit, indicated generally at 10, that illustrate an embodiment of a method for forming integrated circuit 10 according to the present invention. In the illustrated embodiment, integrated circuit 10 comprises a memory device with an array of storage cells having segmented gates that are self-aligned to shallow trench isolation regions. Specifically, the array of storage cells produced by this method can advantageously be used in a dynamic random access memory (DRAM) device with a shared, or folded, bit line structure. However, the teachings of the present invention are not limited to DRAM applications. The segmented, self-aligned gates can be used in other appropriate applications that call for conductors with a pitch that is less than the minimum lithographic dimension. These conductors are referred to as "sub-lithographic" conductors.

Figure 1A:
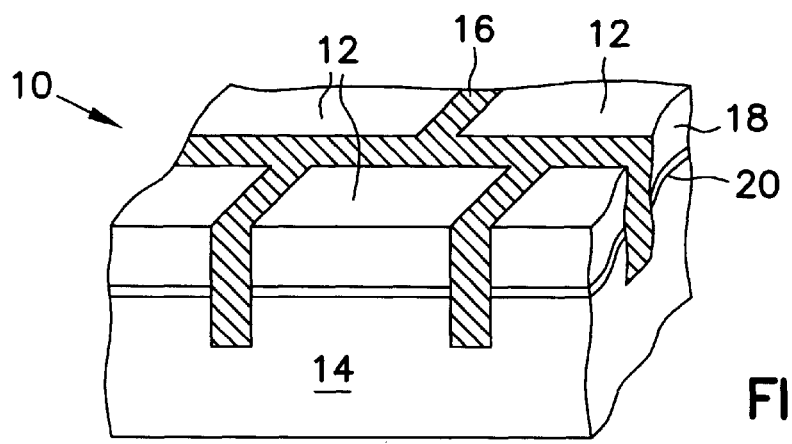
FIGS. 1A through 1F are perspective views of a portion of an integrated circuit that illustrate an embodiment of a method for forming the integrated circuit with self-aligned gate segments.

Referring to FIG. 1A, a number of active regions 12 are established for layer of semiconductor material 14 by shallow trench isolation region 16. The method produces two cells for memory device 10 in each active region 12. Shallow trench isolation region 16 is formed by first etching a trench through nitride layer ("pad") 18, oxide layer 20 and into layer of semiconductor material 14. The trench is over-filled with, for example, an oxide in a chemical vapor deposition (CVD) process. Shallow trench isolation region 16 is completed by polishing a working surface of the oxide back to a surface of nitride layer 18 using, for example, an appropriate planarization technique such as chemical mechanical planarization.

Figure 1B:
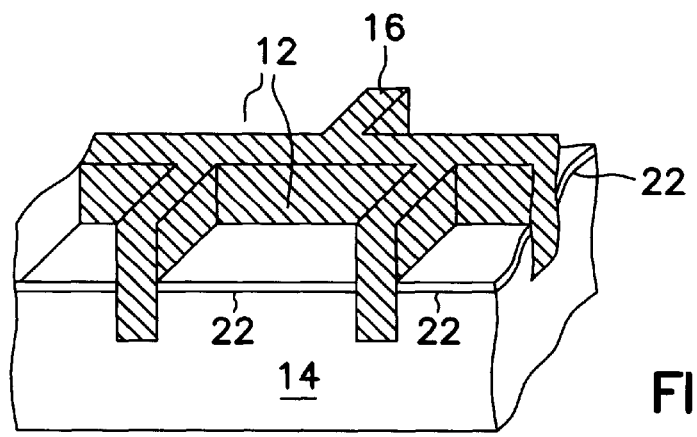
Figure 1C:
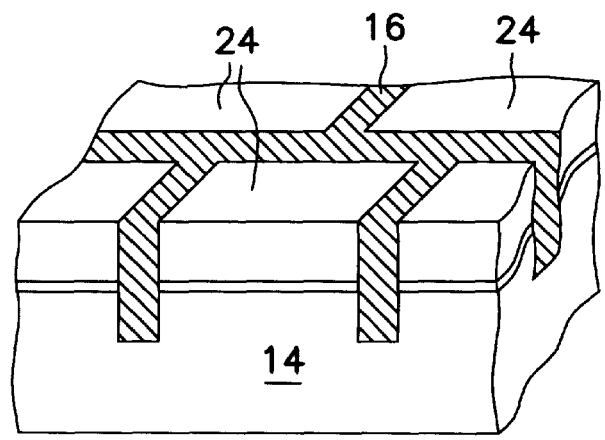

Referring to FIG. 1B, nitride layer 18 and oxide layer 20 are removed from layer of semiconductor material 14. This leaves a portion of shallow trench isolation region 16 extending outwardly from layer of semiconductor material 14 and surrounding and isolating active regions 12. This portion of shallow trench isolation region 16 is used to align the gate segments and confine the gate segments to active regions 12. Next, gate oxide layer 22 is formed in active regions 12 by, for example, growing a layer of silicon dioxide outwardly from layer of semiconductor material 14. Conductive layer 24 is formed outwardly from gate oxide layer 22 and covers active regions 12 and shallow trench isolation region 16. Conductive layer 24 typically comprises poly-silicon that is deposited using a chemical vapor deposition technique. A chemical/mechanical polish method is used to planarize the poly-silicon of conductive layer 24 to the level of the shallow trench isolation region 16, leaving poly-silicon in active regions 12 as shown in FIG. 1C.

Figure 1D:
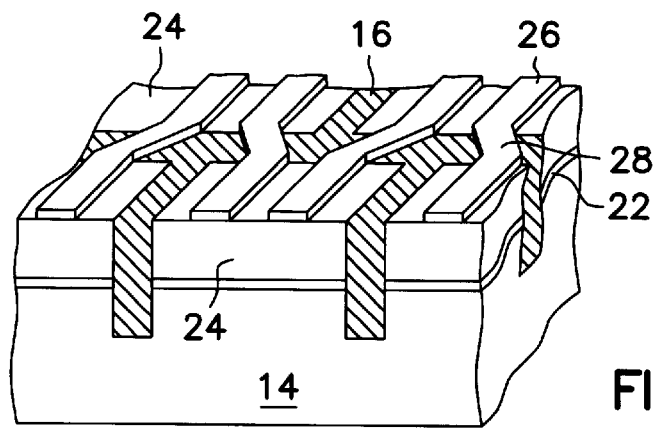

Referring to FIG. 1D, the method next defines the position of the gate segments. Photoresist layer 26 is deposited outwardly from shallow trench isolation region 16 and conductive layer 24. Photoresist layer 26 is exposed to produce, for example, a conventional word line pattern as shown. In a conventional application, the word line pattern is used to simultaneously form the gates of the access devices and the interconnections between gates of adjacent devices in the memory array. In this embodiment, a portion of the remaining photoresist layer 26 passes over shallow trench isolation region 16 as indicated at 28, for example.

Figure 1E:
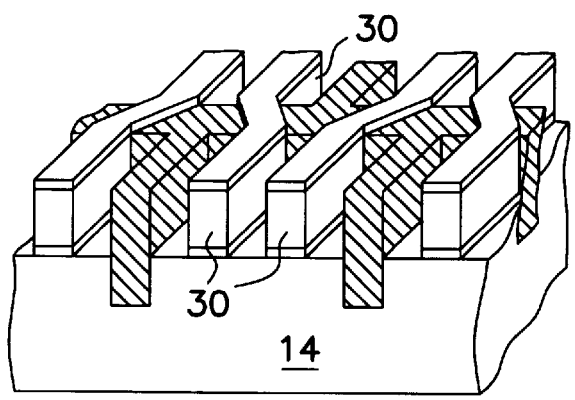
Figure 1F:
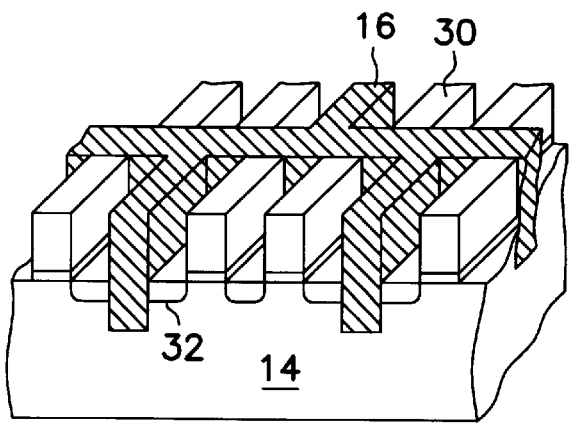

Referring to FIG. 1E, portions of conductive layer 24 are selectively removed to form two gate segments 30 in each active region 12. Photoresist layer 26 and exposed portions of gate oxide layer 22 are removed as shown in FIG. 1F. Thus, the method produces gate segments 30 that are self-aligned by shallow trench isolation region 16. Once gate segments 30 are formed, source/drain regions 32 are formed by, for example, ion implantation in layer of semiconductor material 14.

Formation of Sub-Lithographic Word Lines

Figure 2A:
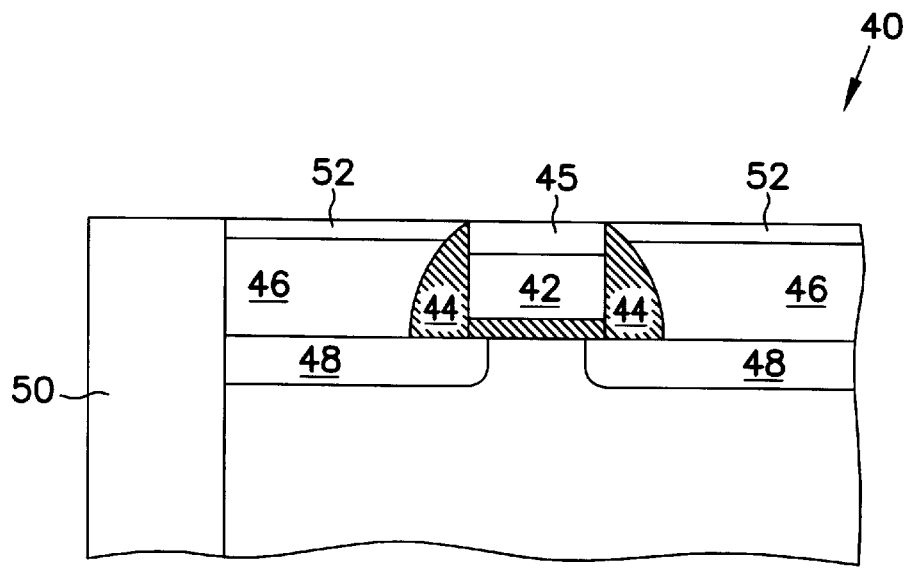
FIGS. 2A and 2B are cross sectional views of an integrated circuit that illustrate an embodiment of a method for forming sub-lithographic word lines.
Figure 2B:
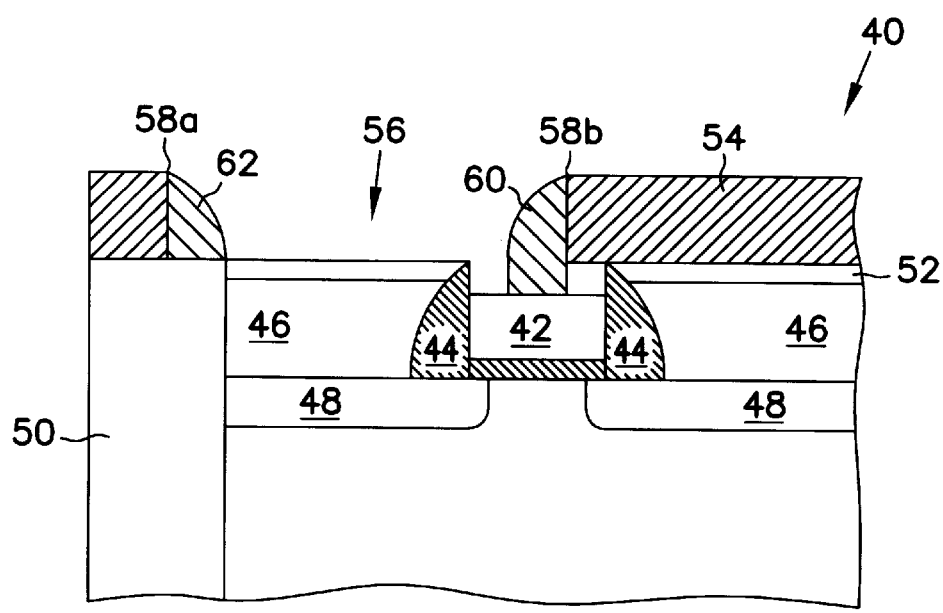

FIGS. 2A and 2B are cross sectional views of an integrated circuit, indicated generally at 40, that illustrate an embodiment for forming sub-lithographic word lines. These word lines can be used, for example, to interconnect gate segments 30 of FIG. 1F to form an array for a memory device. Such sub-lithographic word lines have widths that are less than the minimum feature size of the process, and thus allow such memory arrays to be constructed with folded-digit-line architecture without the word lines being electrically shorted together. Of course, such reduced-area memory arrays can be constructed with a shared-digit-line architecture using conventional process technology to form conventional word lines. Thus, the techniques shown in FIGS. 2A and 2B are not required to form a shared-digit-line architecture.

Referring to FIG. 2A, integrated circuit 40 includes gate segment 42 that is formed, for example, according to the technique described above with respect to FIGS. 1A through 1F. Gate segment 42 is capped with, for example, nitride pad layer 45. Insulative sidewalls 44 are formed adjacent to the exposed vertical sidewalls of gate segment 42 using conventional techniques. For example, a layer of silicon dioxide is deposited using a chemical vapor deposition (CVD) process on exposed surfaces. The layer is then anisotropically etched to form insulative sidewalls 44. Conductive material is deposited adjacent to the sidewalls to form contacts 46 for source/drain regions 48 and is conventionally polished back to the exposed surface of trench isolation regions 50 and pad layer 45. Contacts 46 are further etched back so as to become recessed with respect to the surface pad layer 45. Next, insulator layer 52, such as an oxide, is conventionally grown or deposited and then polished back to the surface of trench isolation region 50 and pad layer 45 to give the structure shown in FIG. 2A.

Referring to FIG. 2B, mandrel 54 is conventionally formed on layer 52 and pad layer 45. In one embodiment, mandrel 54 is formed from intrinsic (undoped), polysilicon. Mandrel 54 is then polished to smooth its upper surface.

Next, groove 56 is etched in mandrel 54 to expose sidewalls 58a and 58b in mandrel 54. Sidewall 58a is over trench isolation region 50, and sidewall 58b is over gate segment 42. An anisotropic etch removes the exposed portion of pad layer 45 and thus exposes a region of gate 42. A conductive material such as poly-silicon is formed in groove 56. The conductive material is anisotropically etched to leave conductive sidewalls that become sub-lithographic word lines 60 and 62. In one embodiment, mandrel 54 is then removed. In another embodiment, mandrel 54 and word lines 60 and 62 are polished or etched to make the shape of word lines 60 and 62 more rectangular, and to center word line 60 over gate 42.

Formation of Stacked Capacitors

Figure 3:
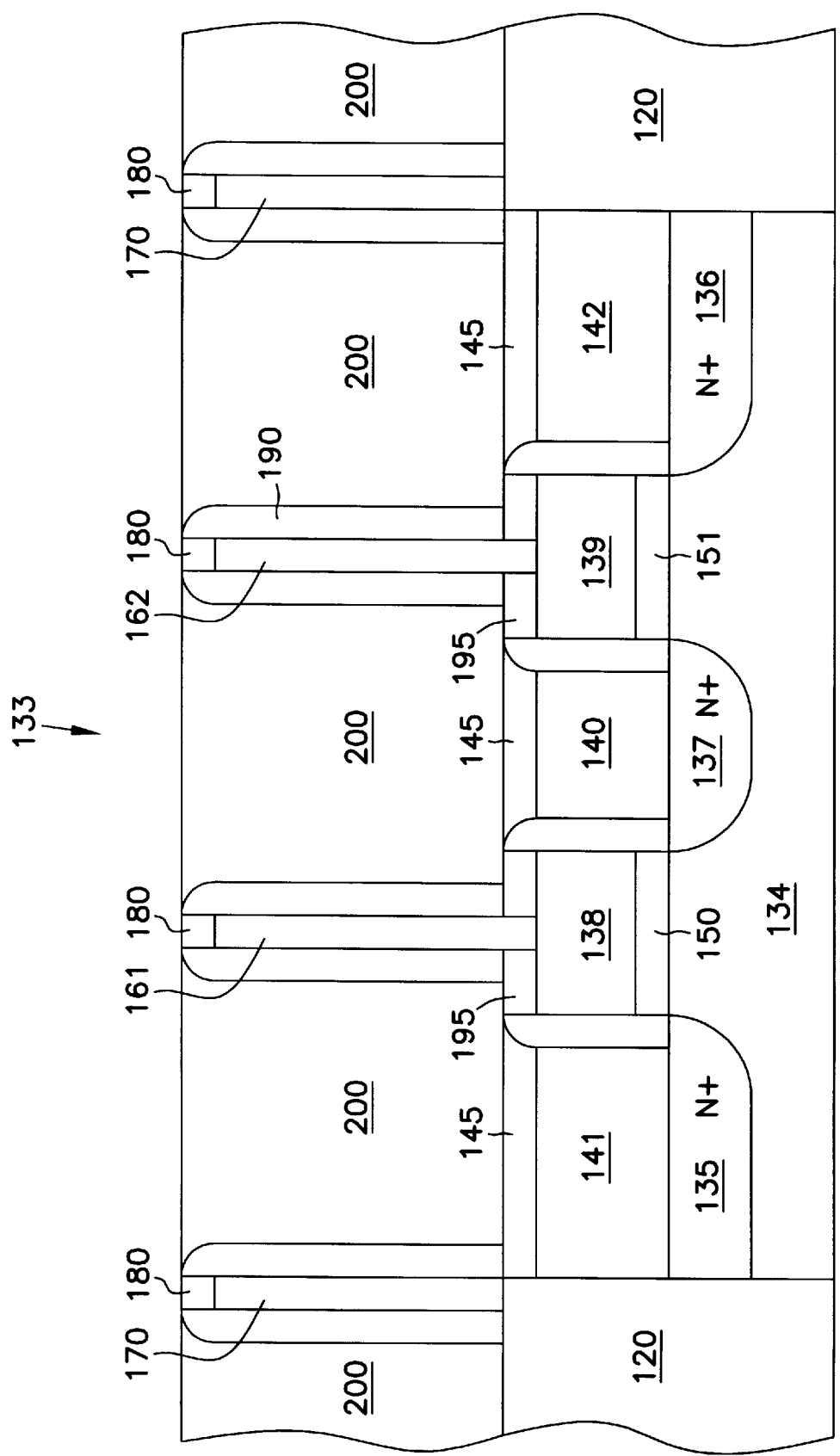

FIGS. 3 through 17 are cross section and plan views of an integrated circuit that show one embodiment of a method for forming stacked capacitors in a reduced-area memory array wherein the memory array has sub-lithographic, edge-defined word lines formed, for example, as described above with respect to FIGS. 2A and 2B. FIG. 3 illustrates one embodiment of an integrated circuit in which memory cells share a bit line. This embodiment is shown by way of example and is not a limitation of the present invention. Alternate embodiments exist, such as a conventional memory cell having its own bit line, and are within the scope of the present invention.

Referring to FIG. 3, silicon substrate 134 provides a strong base for the semiconductor layers of integrated circuit 133. The term substrate refers to the base semiconductor layer or layers or structures of an integrated circuit which includes active or operable portions of semiconductor devices. In addition shallow trench isolation 120 provides support and isolation between the devices in integrated circuit 133.

N+ diffusion regions 135, 136, and 137 are formed in substrate 134 by introducing any suitable N-type dopant into substrate 134. The N-type dopant, such as phosphorus, is typically introduced by diffusion or ion implantation. Device gates 138 and 139 typically comprise poly-silicon and are separated from substrate 134 by thin layers of oxide 150 and 151 respectively in order to limit the gate current to a negligible amount. In this configuration, N+ diffusion region 135, device gate 138, substrate 134, and N+ diffusion region 137 define a first transistor. Similarly, N+ diffusion region 136, device gate 139, silicon substrate 134, and N+ diffusion region 137 define a second transistor. The transistors are shown as exemplary only, in an alternate embodiment, any suitable semiconductor device may be formed in substrate 134 without departing from the scope of the present invention.

The center N+ diffusion region 137 acts as a common source or drain while the N+ diffusion regions 135 and 136 act as independent sources or drains depending upon the voltage applied to the regions. In one embodiment, the transistors are essentially enhanced n-channel MOS transistors. Alternatively, any transistor configuration suitable for memory cell access may readily be used.

Integrated circuit 133 comprises contact regions which can be any appropriate conductive material such as poly-silicon. These contact regions are coupled to the N+ diffusion regions. Contact region 140 is coupled to N+ diffusion region 137 while contact regions 141 and 142 are coupled with the N+ diffusion regions 135 and 136 respectively. The contact insulating layers 145 comprise a conventional thin film insulator such as silicon nitride, $Si_3N_4$ and insulate contact regions 140, 141, and 142.

Integrated circuit 133 comprises conductors 161 and 162 which extend normal to the substrate 134 and are formed outwardly from device gates 138 and 139. Conductors 161 and 162 are sub-lithographic, edge-defined word lines of a suitable conductor such as poly-silicon. In another embodiment, the edge-defined word lines comprise any suitable conductive material such as a conventional metal.

Sub-lithographic, edge-defined word lines 161 and 162 are formed outwardly from device gates 138 and 139 using semiconductor fabrication techniques as are known in the art. "Passing" conductors 170 form a second pair of conductors which provide a conductive path to adjacent memory cells in integrated circuit 133.

FIG. 4A, which is atop view of integrated circuit 133, illustrates the interconnection of the memory cells of integrated circuit 133. Specifically, FIG. 4A illustrates how conductors 161 and 162 are coupled with device gates 138 and 139 respectively within memory cell 250. FIG. 4A also illustrates how passing conductors 170 pass through memory cell 250 and are coupled to device gates 251 and 252 of adjacent memory cells 256 and 257. Note that memory cells 256 and 257 are only partially shown.

Referring again to FIG. 3, conductors 161 and 162 are capped with insulator 180 and are lined with insulator 190. Insulator 195 insulates device gates 138 and 139. Any suitable semiconductor insulator such as $SiO_2$ may be used for insulators 180, 190, or 195.

In order to form stacked capacitors outwardly from substrate 134 of integrated circuit 133, a material with a high degree of etch selectivity is used. The suitable material, such as intrinsic poly-silicon 200, is deposited between the conductors 161 and 162 and passing conductors 170 by a conventional process such as chemical-vapor deposition (CVD). As is well-known in the art, CVD is the process by which gases or vapors are chemically reacted, leading to the formation of a solid on a substrate. The high degree of etch selectivity of a material such as intrinsic poly-silicon is advantageous because it allows intricate etching without disturbing the surrounding semiconductor regions.

Next, a photoresist and a mask is used to reveal the plurality of semiconductor memory cells of substrate 134. FIG. 4B illustrates the layout of the mask. First, a photoresist is applied to the entire integrated circuit 133. Masked areas 260 illustrate the areas of photoresist 270 which are covered by a mask and therefore are not hardened when exposed to ultraviolet light.

Figure 5:
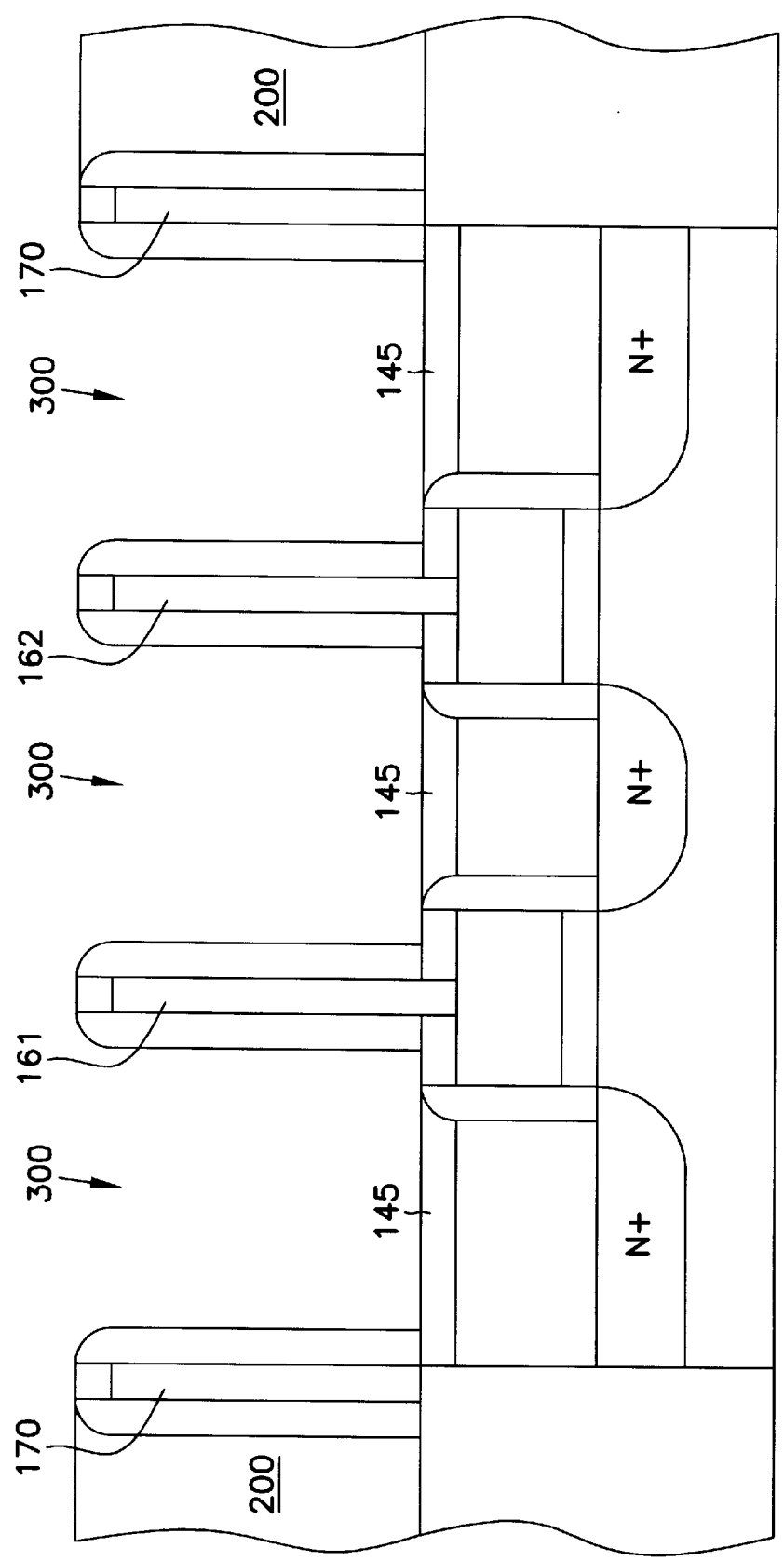

After exposing the resist and mask, the intrinsic poly-silicon 200 between conductors 161 and 162 and passing conductors 170 is removed by selectively etching the material. As illustrated in FIG. 5, three stud holes 300 are created in integrated circuit 133. Stud holes 300 extend into integrated circuit 133 toward substrate 134 and ultimately reveal contact insulating layers 145. The portions of the intrinsic poly-silicon 200 which are covered by the mask are not etched.

Figure 6A:
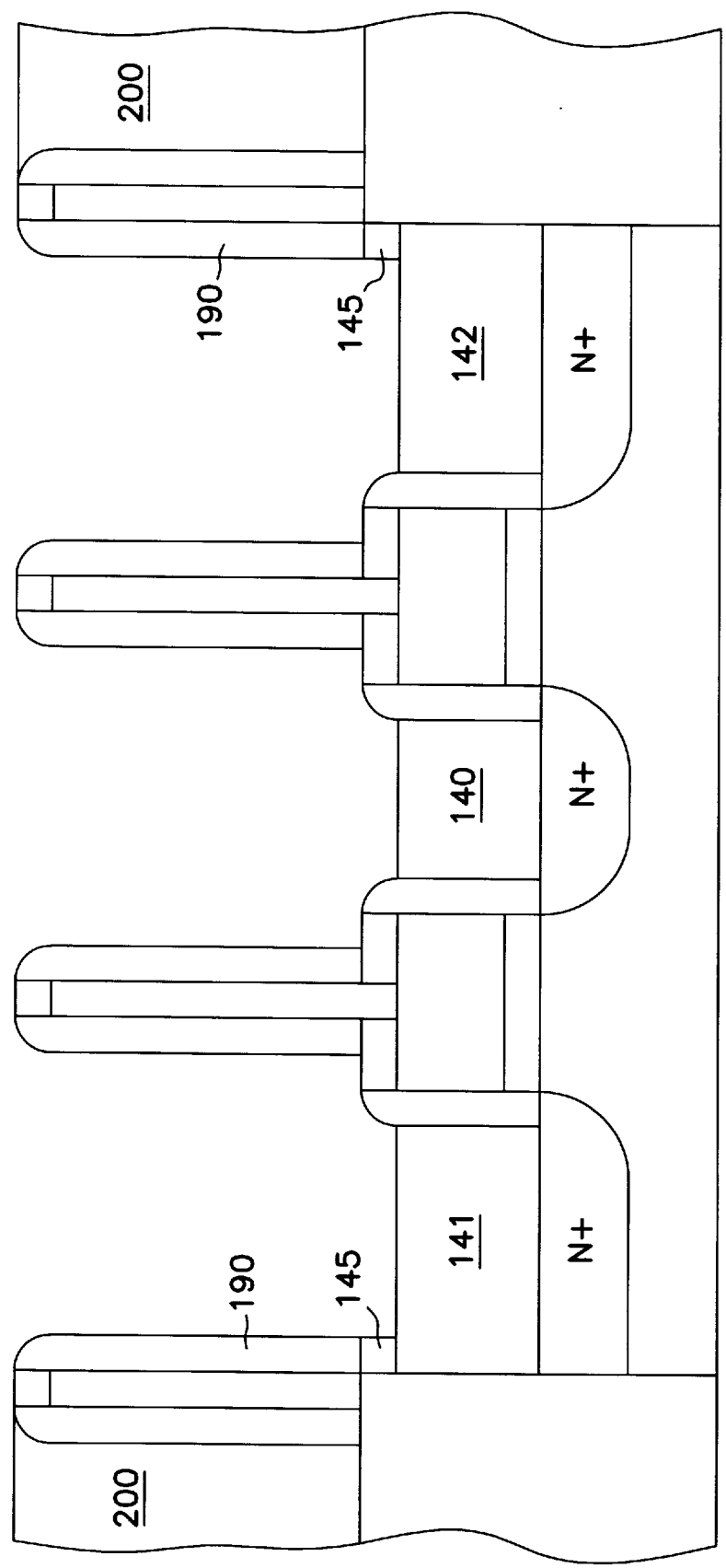

With the mask still present on the surface of the wafer, the exposed contact insulating layers 145 are etched. This step exposes contact regions 140. FIG. 6A illustrates how contact insulating layers 145 are etched and how small portions of contact insulating layers 145 remain between insulator 190 and contact regions 141 and 142. At this point, photoresist 270 is removed.

Figure 6B:
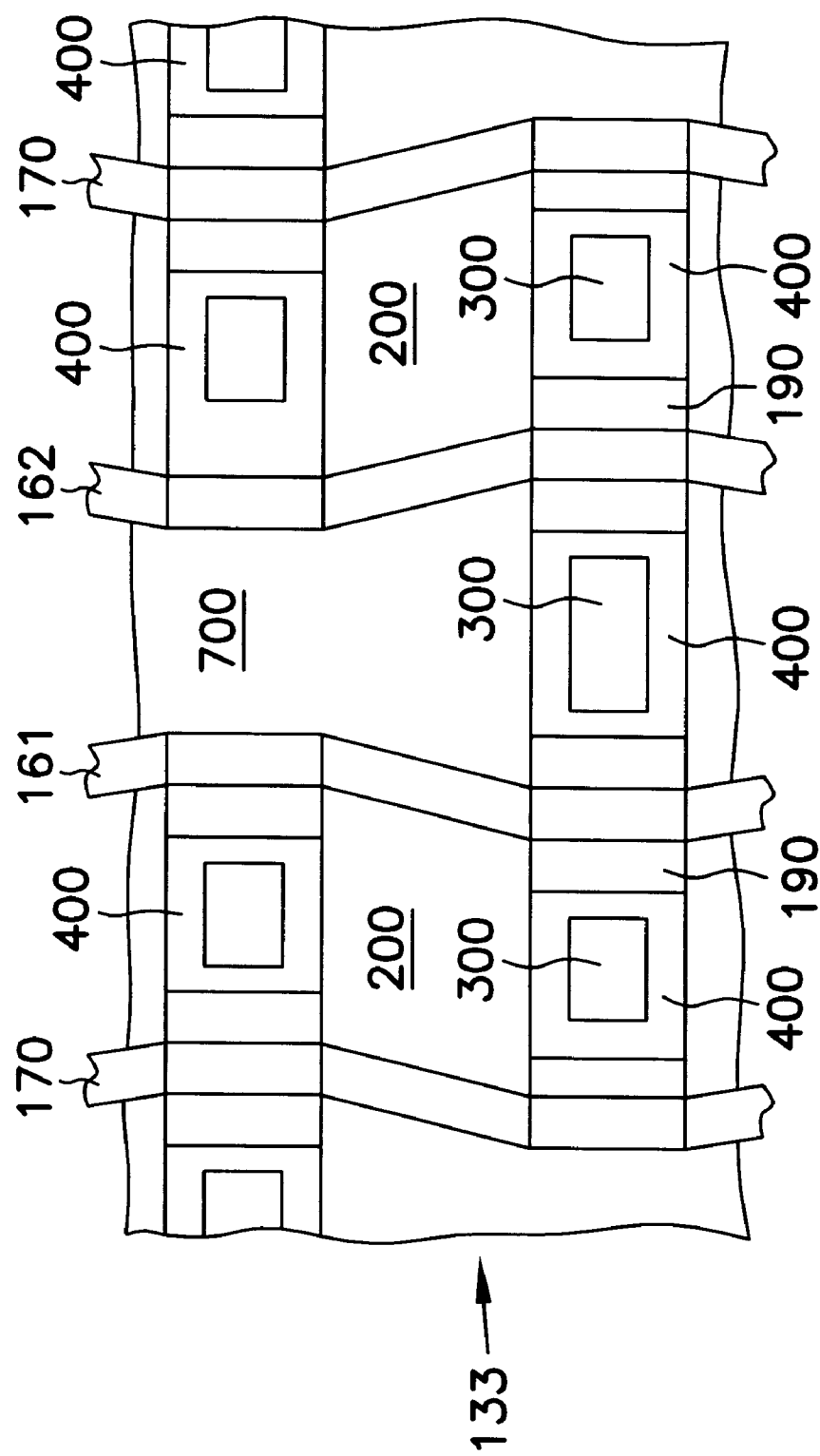

As illustrated in FIG. 6B, which is a top view of integrated circuit 133, after exposing contact regions 141 and 142, an insulator such as $SiO_2$ is CVD deposited on the walls of the openings between conductors 161 and 162 and passing conductors 170. This step creates insulating sleeve 400 which lines insulator 190 and intrinsic poly-silicon 200 but covers the recently exposed surfaces of contact regions 140, 141, and 142. The additional layer of insulation is advantageous because it reduces the size of the three stud holes 300 and reduces parasitic capacitances of conductive connections between the active regions of substrate 134 and the stacked capacitors which will be formed.

This deposition is followed by a directional (anisotropic) etch such as a dry reactive ion etch (RIE) which removes the recently deposited oxide from all horizontal surfaces but leaves it on the vertical surfaces. This removes the insulator from the recently exposed contact regions 140, 141, and 142. It is necessary to correctly time the etch so that it does not inadvertently etch the horizontal oxide layers 195 which insulates the base of conductors 161 and 162 and device gates 138 and 139. As a result of the directional etch, the three stud holes 300 are lined with an insulating sleeve 400.

Figure 7A:
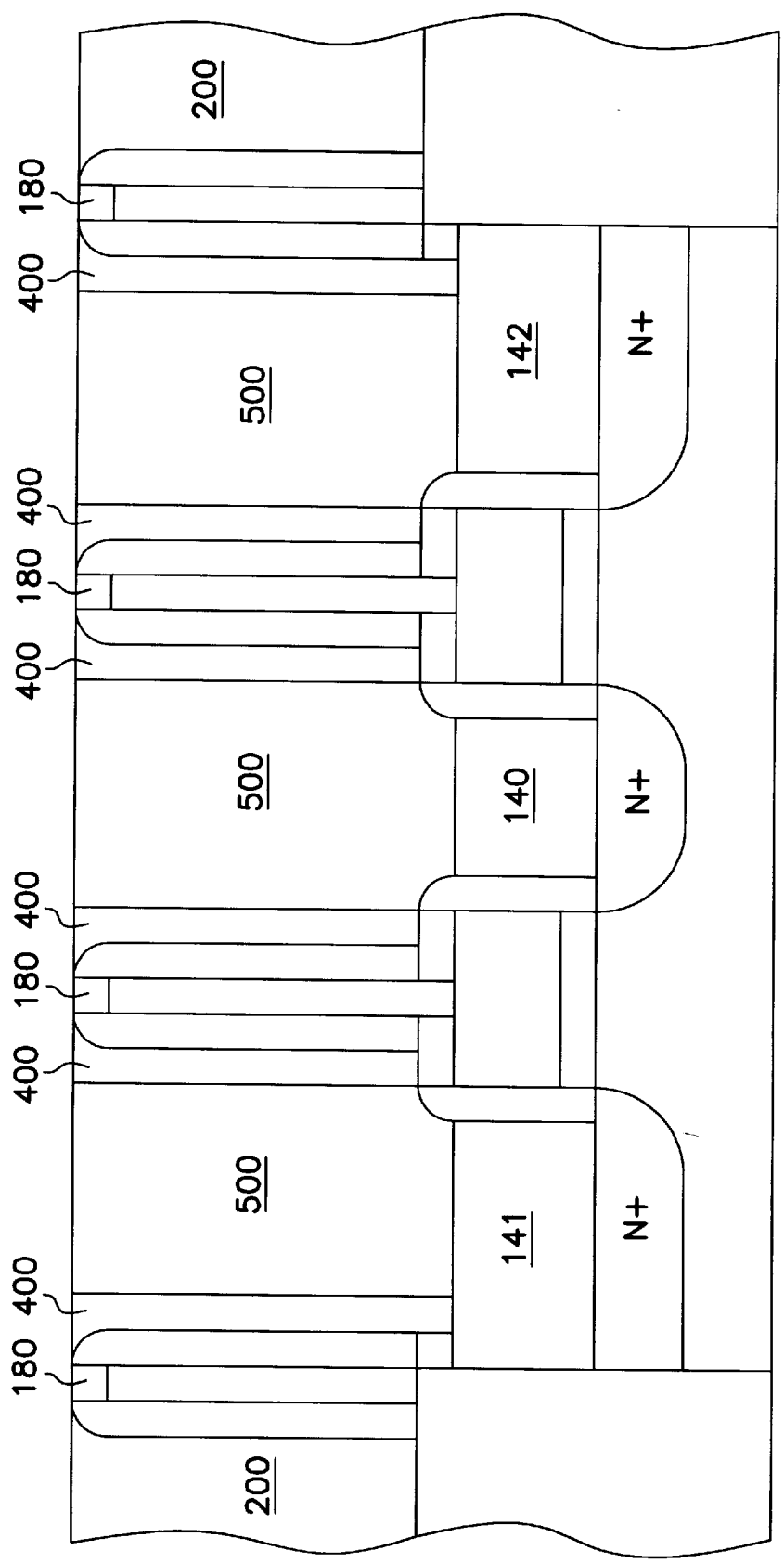

As illustrated in FIG. 7A, the next step in the process is to fill stud holes 300 with a conductive material such as doped poly-silicon 500 by conventional chemical-vapor deposition. Doped poly-silicon 500 is planarized so that it is flush with oxide caps 180 by chemical mechanical polishing (CMP). The doped poly-silicon 500 provides a conductive paths to contact regions 140, 141 and 142. In this manner, the conductive paths formed by doped poly-silicon 500 are bounded by conductors 161 and 162 and passing conductors 170.

Figure 7B:
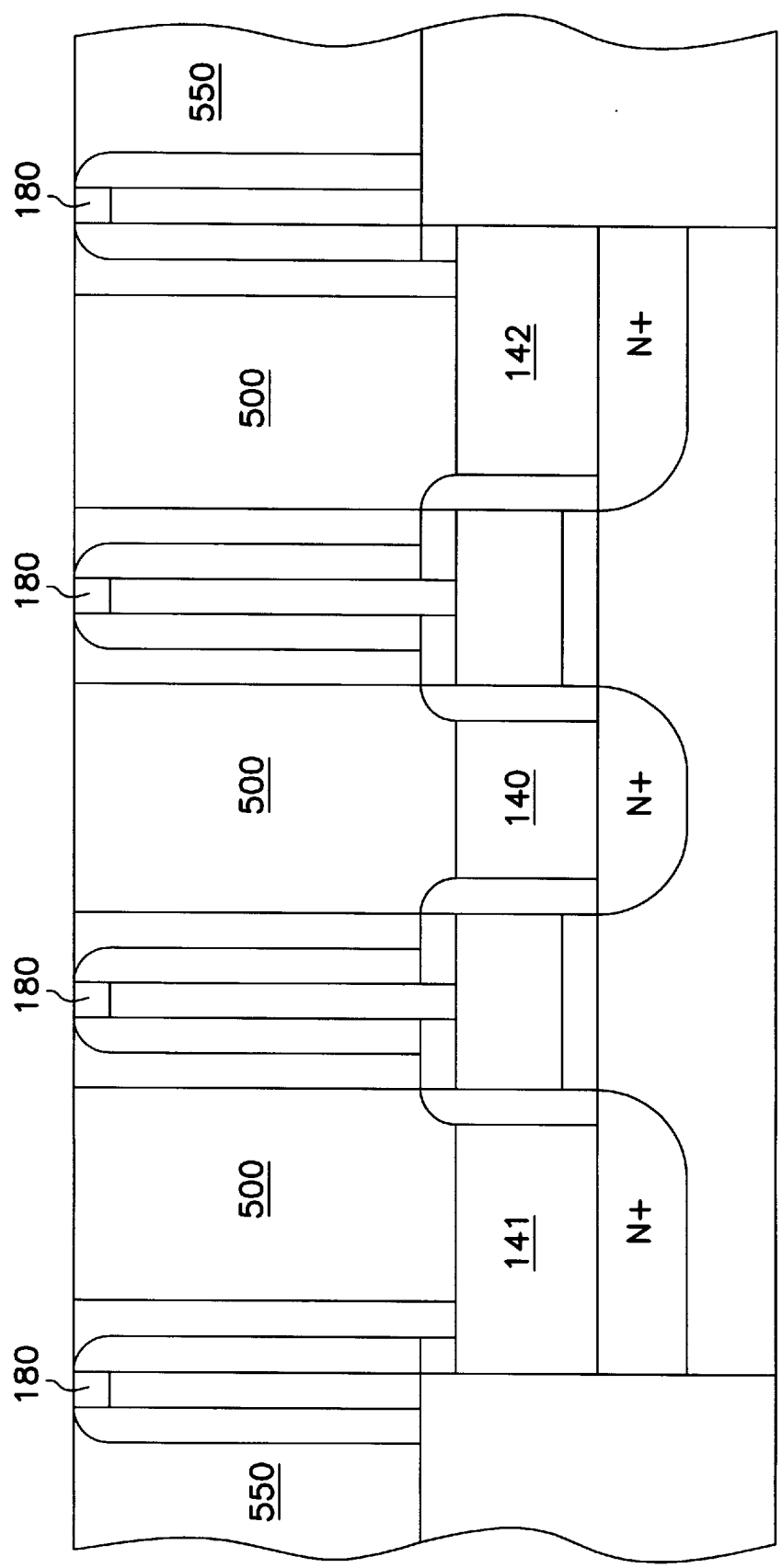

Next, as illustrated in FIG. 7B, the remaining portions of intrinsic poly-silicon 200, which were hidden by mask 270, are selectively etched. Insulator 550, which may be any conventional insulator such as $SiO_2$, is deposited on the entire wafer to fill the void regions in the wafer where intrinsic poly-silicon 200 was removed. Insulator 550 is then planarized by a conventional process so that the insulator is planar with oxide caps 180 and doped poly-silicon 500. The resulting formation is shown in FIG. 7B and is virtually identical to FIG. 7A with the exception that intrinsic poly-silicon 200 has been replaced with oxide filler 550.

At this point in the fabrication of the stacked capacitors, the process has effectively provided conductive paths between the sub-lithographic, edge-defined word lines to the active regions of the substrate. The remaining steps in the process form the stacked capacitors.

Figure 8:
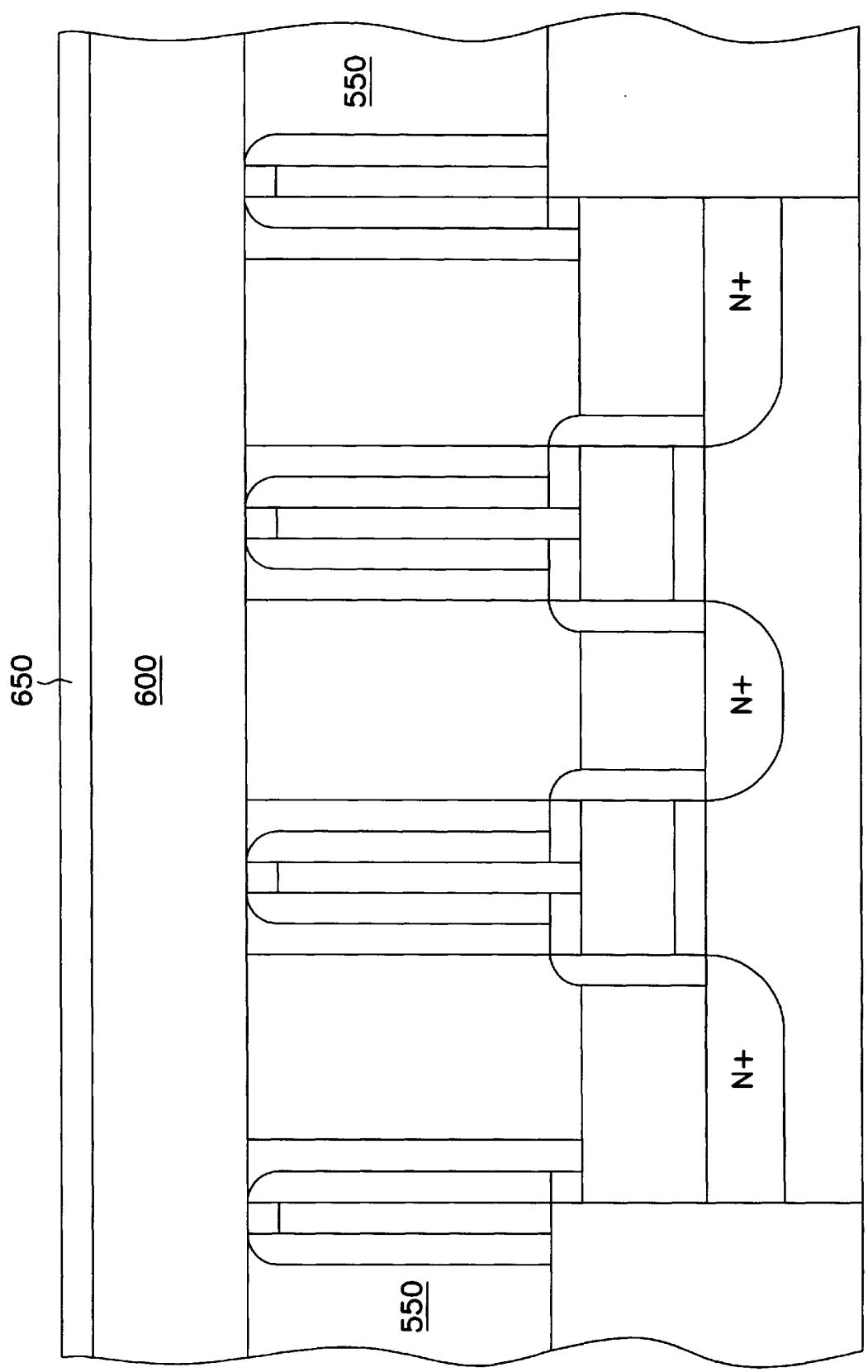

As illustrated in FIG. 8, a thick layer of intrinsic poly-silicon 600 is CVD deposited on the entire wafer. This layer should be at least 0.5 microns thick. Next, a thin mask 650 is created by depositing a conventional thin film insulator such as $Si_3N_4$ on the thick layer of intrinsic poly-silicon 600. The thin mask 650 should be approximately 500 angstroms thick.

Figure 9:
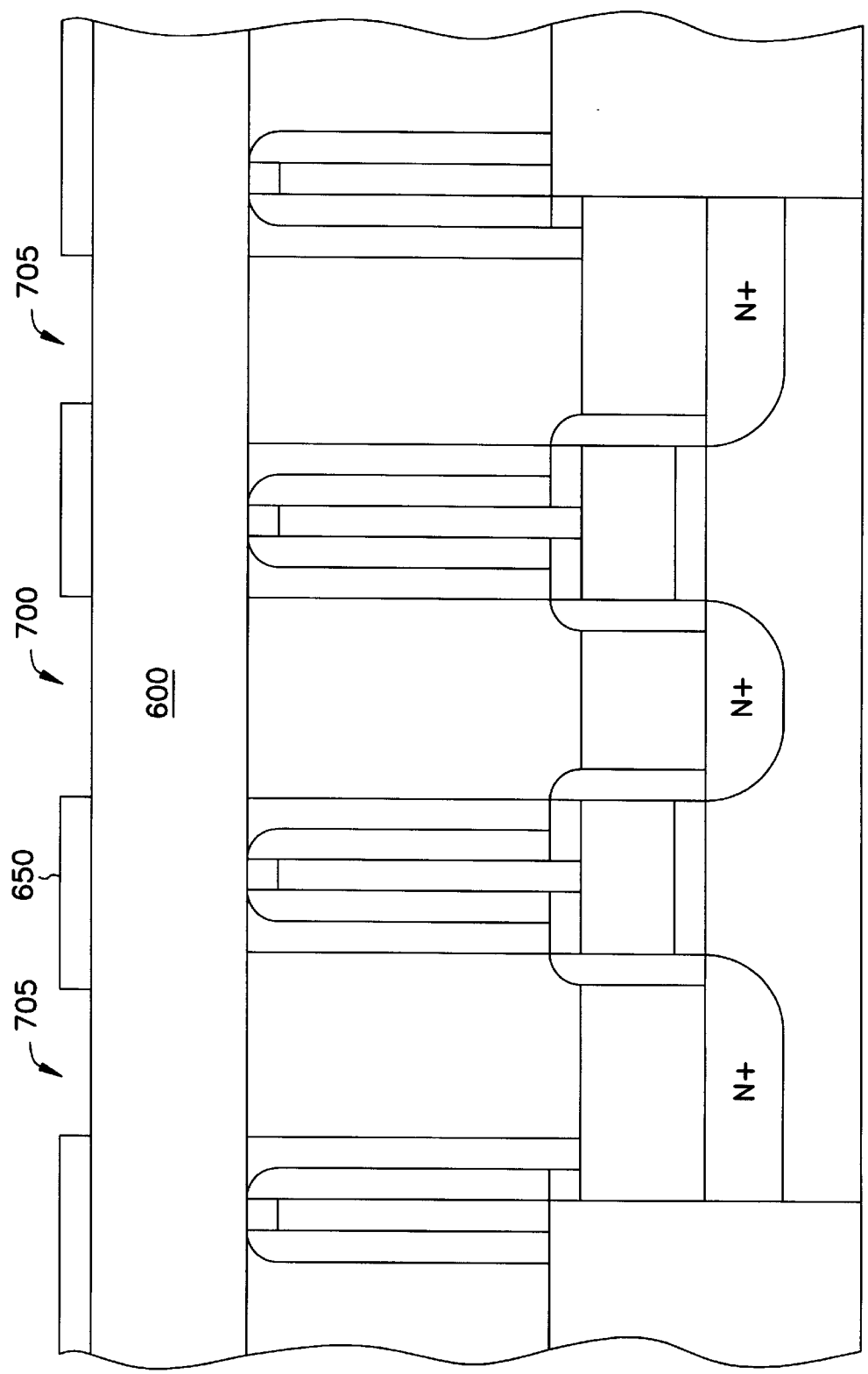

Next, a resist is applied to the wafer and is used to define openings over the doped poly-silicon 500. As illustrated in FIG. 9, three holes are etched in thin mask layer 650. The center hole 700 will ultimately be used for contacting the center region of doped silicon poly 500 and the outer holes 705 will be used to form stacked capacitors. Therefore, the sizes and shapes of outer holes 705 should be designed to maximize capacitor size and minimize contact size.

One advantageous feature of thin mask layer 650 is that it will function as a single mask image during the subsequent forming of the stacked capacitors and bit line contact. Specifically, thin mask layer 650 allows separate etching steps for a bit line contact and for the stacked capacitors, yet the formations will inherently be self-aligned because of thin mask layer 650. This feature allows for different etching techniques to be used for stacked capacitors and a bit line contact yet maintains their alignment.

Figure 10:
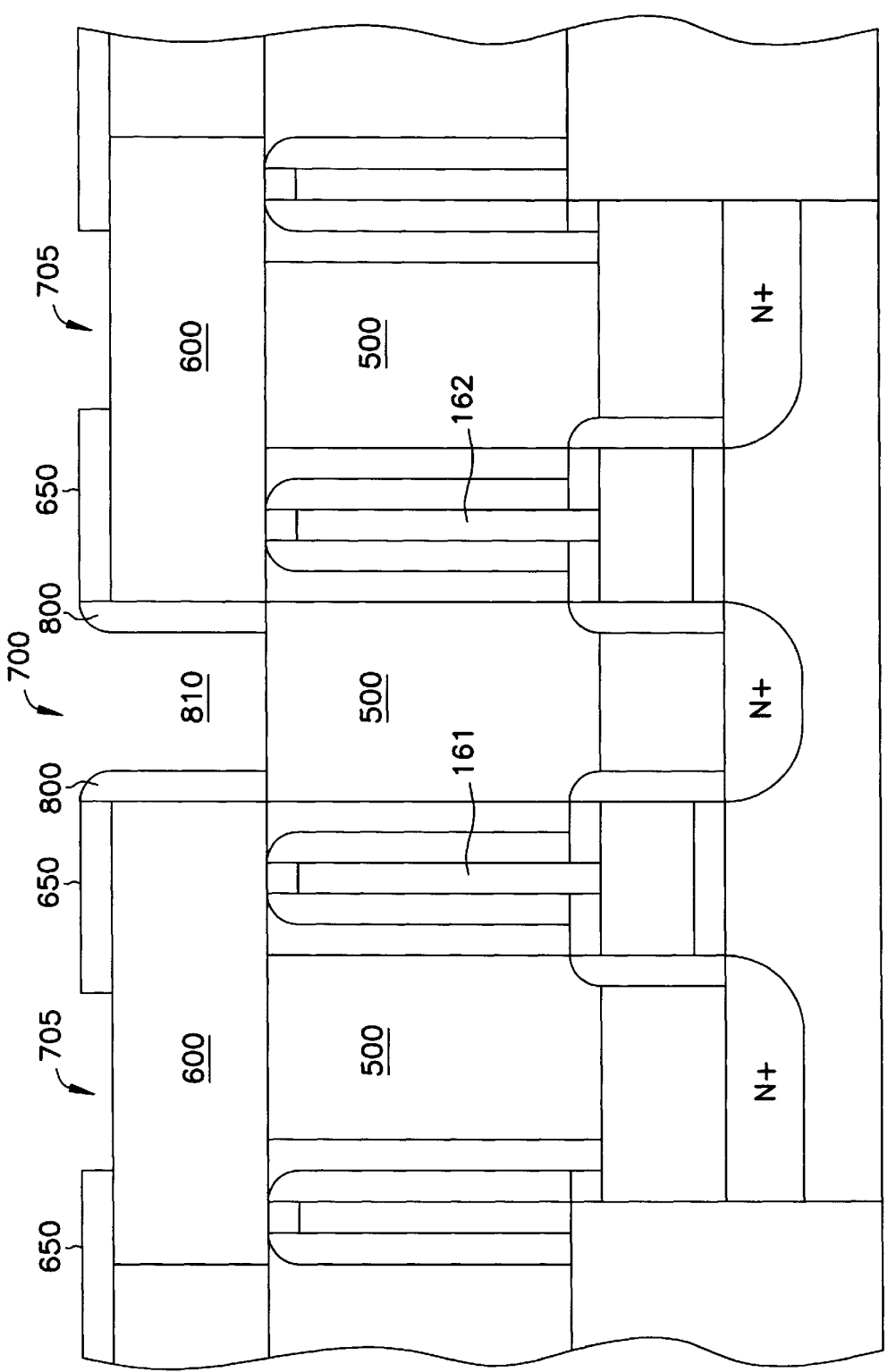

Referring to FIG. 10, after etching the thin mask layer 650, the resist is stripped and a new resist and mask is applied which only exposes center hole 700. Once the new mask is applied, a bit line contact hole 810 is created by anisotropically etching the exposed area of thick layer of intrinsic poly-silicon 600 to reveal the doped poly-silicon 500 between the two conductors 161 and 162. After etching the thick layer of intrinsic poly-silicon 600, an insulator such as $SiO_2$ is deposited and RIE etched to leave a bit line insulating liner 800 on the exposed wall of the intrinsic poly-silicon 600.

Figure 11:
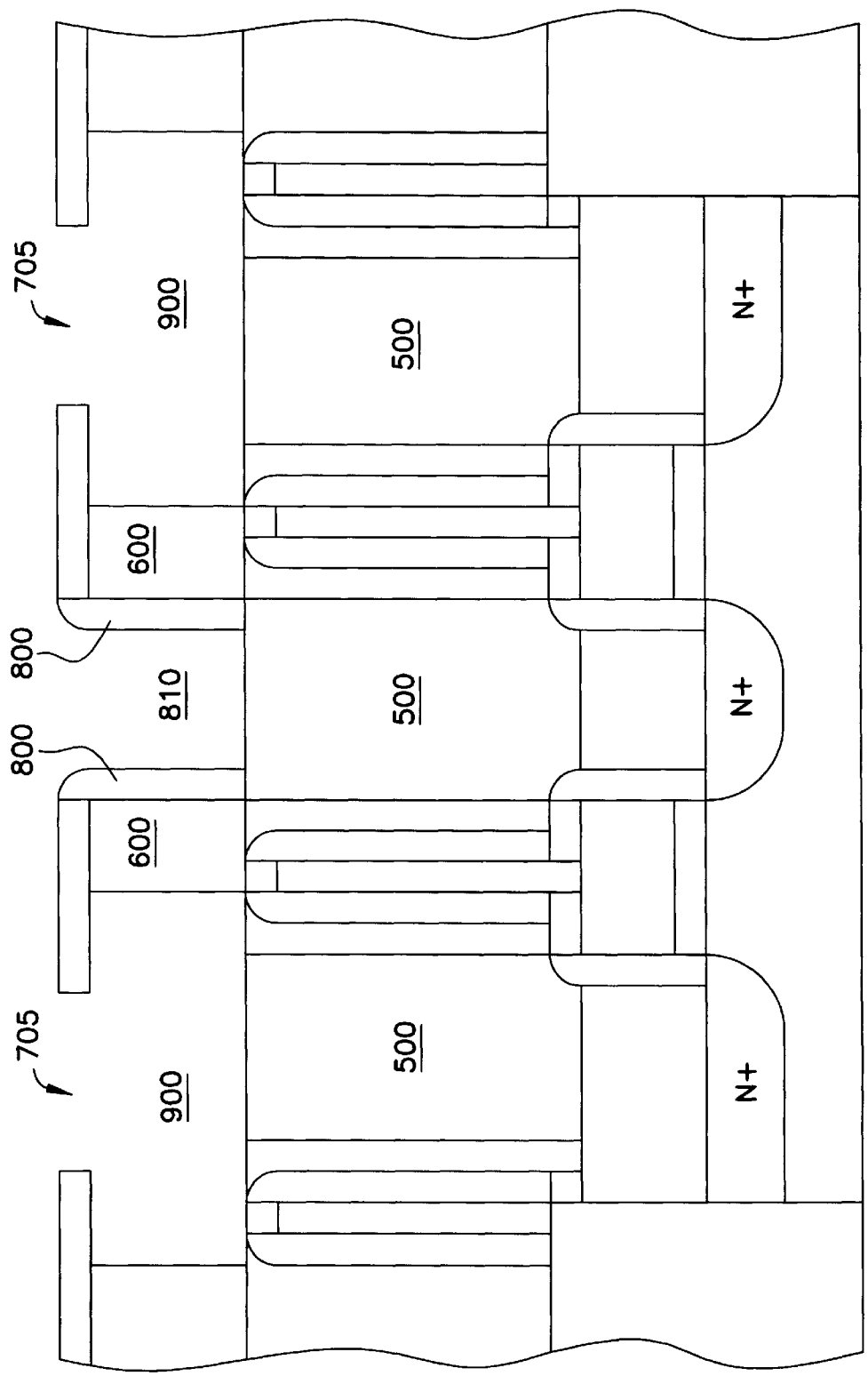

Next, the resist is stripped to expose outer holes 705 of thin film insulator 650. As illustrated in FIG. 11, intrinsic poly-silicon 600 is etched to create two node areas 900. During this step, the thin film insulator 650 acts as a mask so a new mask and resist need not be applied.

It is preferable that the etch have an isotropic component such that the etch is slightly nondirectional. The isotropic component effectively enlarges the size of node areas 900 relative to outer holes 705 in thin film insulator. After etching, the thin mask layer 650 is removed.

Figure 12:
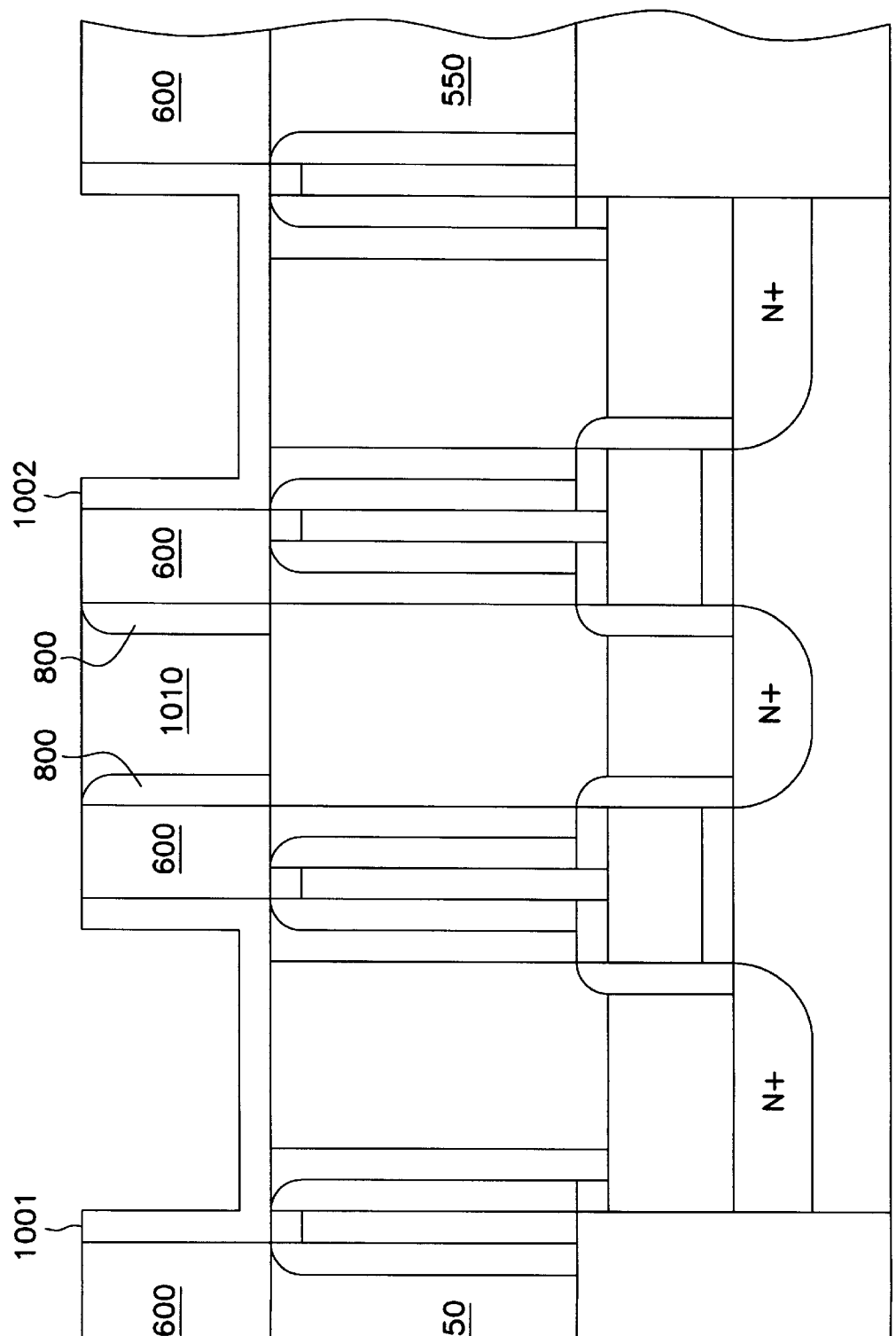

Referring to FIG. 12, a conductive material such as N+ poly-silicon is deposited on integrated circuit 133. Since bit line contact hole 810 is smaller than node areas 900, partly due to bit line insulating liner 800 and partly due the isotropic component, the N+ poly-silicon completely fills the first bit line contact hole 810 and forms a liner in the newly created node areas 900. Filling the first bit line contact hole 810 forms a bit line contact stud 1010. The layer of N+ poly-silicon which is deposited in the node areas 900 forms two storage plates 1001 and 1002; therefore, the thickness of the N+ poly-silicon should be only enough to guarantee filling the first bit line contact hole 810. After creating storage plates 1001 and 1002 and bit line contact stud 1010, the N+ poly-silicon is CMP polished in order to guarantee that storage plates 1001 and 1002 are separated from bit line contact stud 1010.

Figure 13:
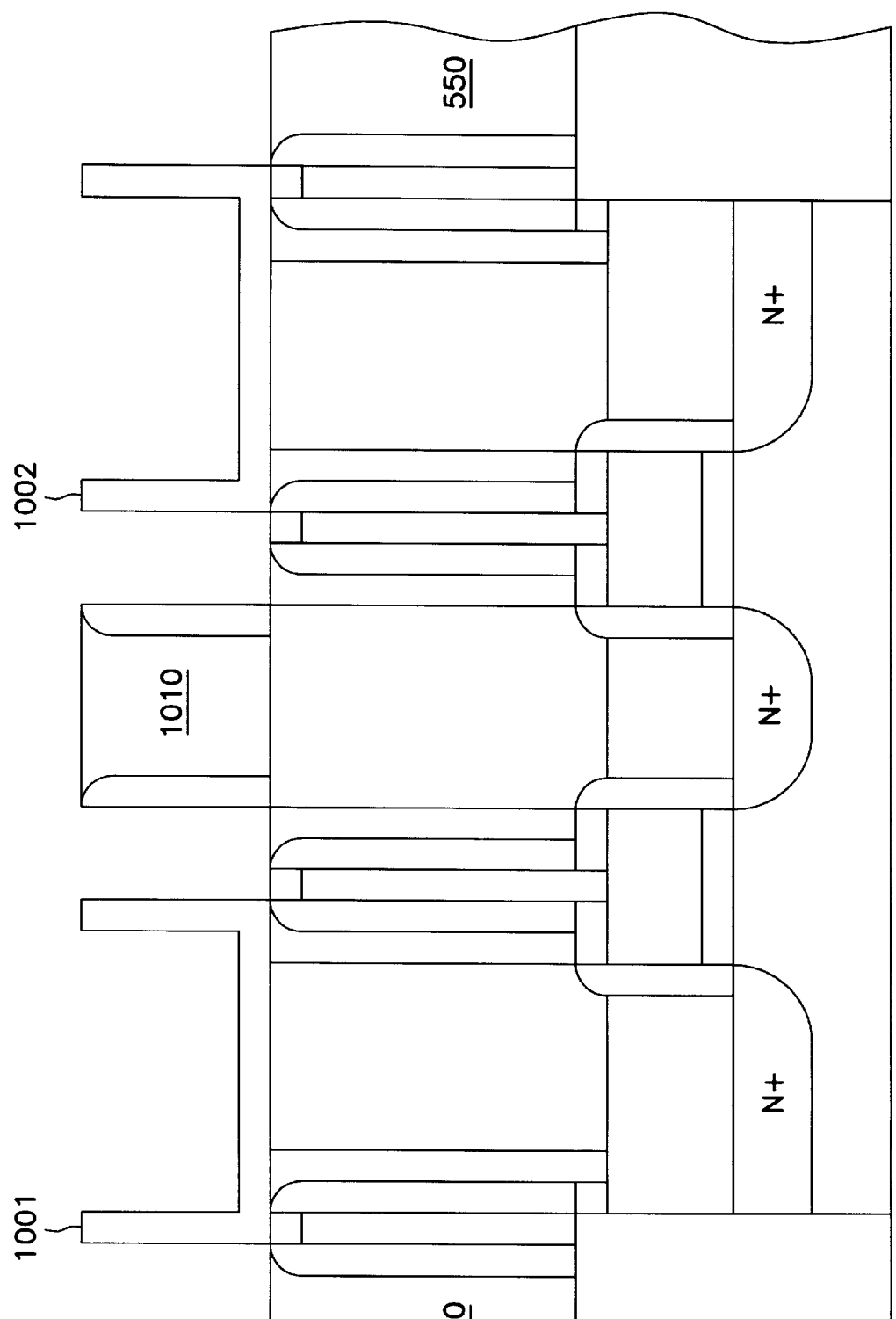

As illustrated in FIG. 13, the remaining intrinsic poly-silicon 600 is selectively etched after the N+ poly-silicon is planarized. This step produces openings in the isolation regions of the semiconductor wafer exposing the oxide filler 550.

Figure 14:
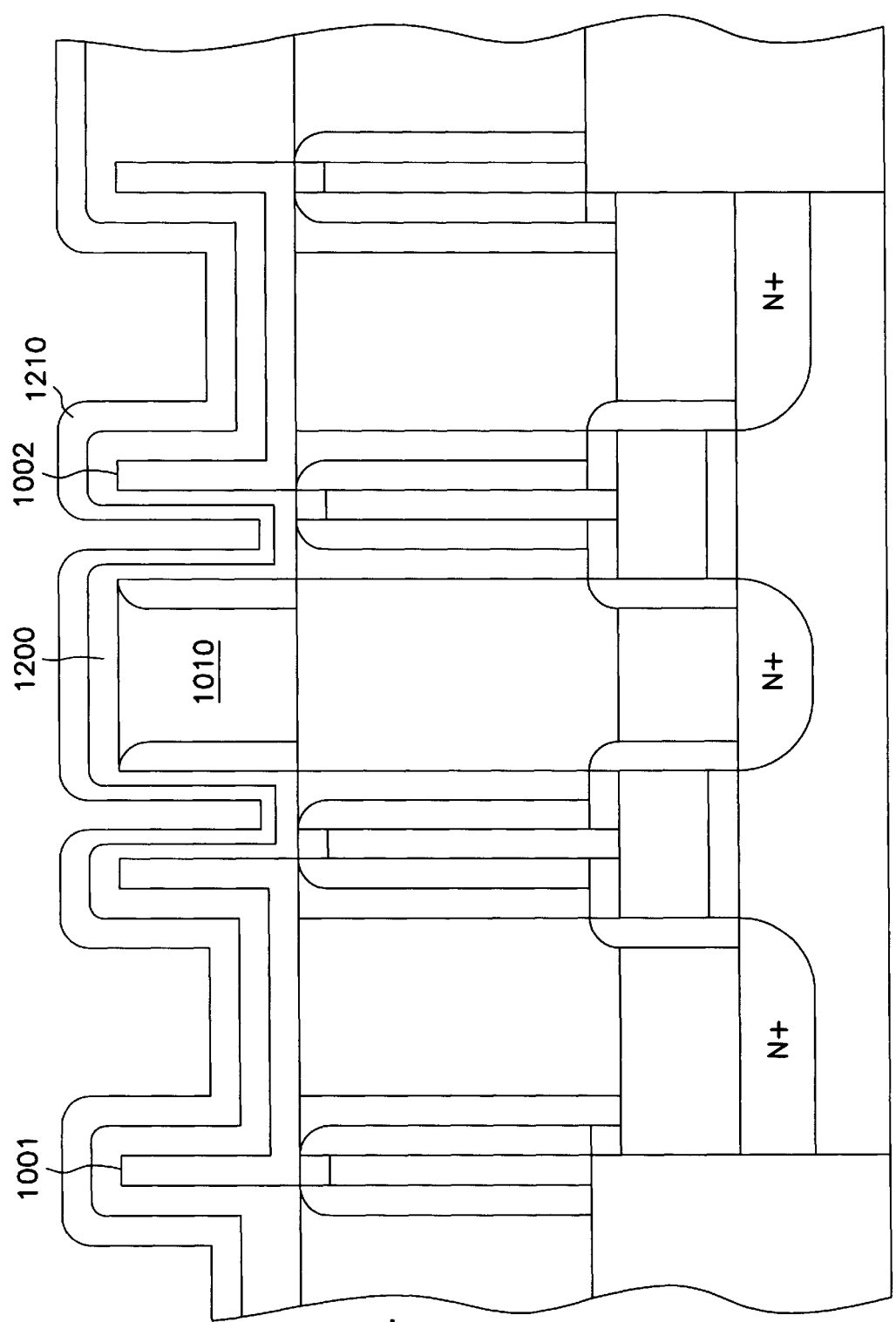

From this point, the inventive method follows conventional steps to form stacked capacitors outwardly from the storage plates 1000. Referring to FIG. 14, dielectric material 1200, which is any suitable dielectric material such as tantalum pentoxide, is deposited. In an alternate embodiment, any suitable dielectric material may be used. Next, the final plate conductor 1210 is deposited on the dielectric material 1200. In one embodiment, platinum is used as the final plate conductor 1210. In another embodiment, any suitable metallic conductor may be used.

Figure 15:
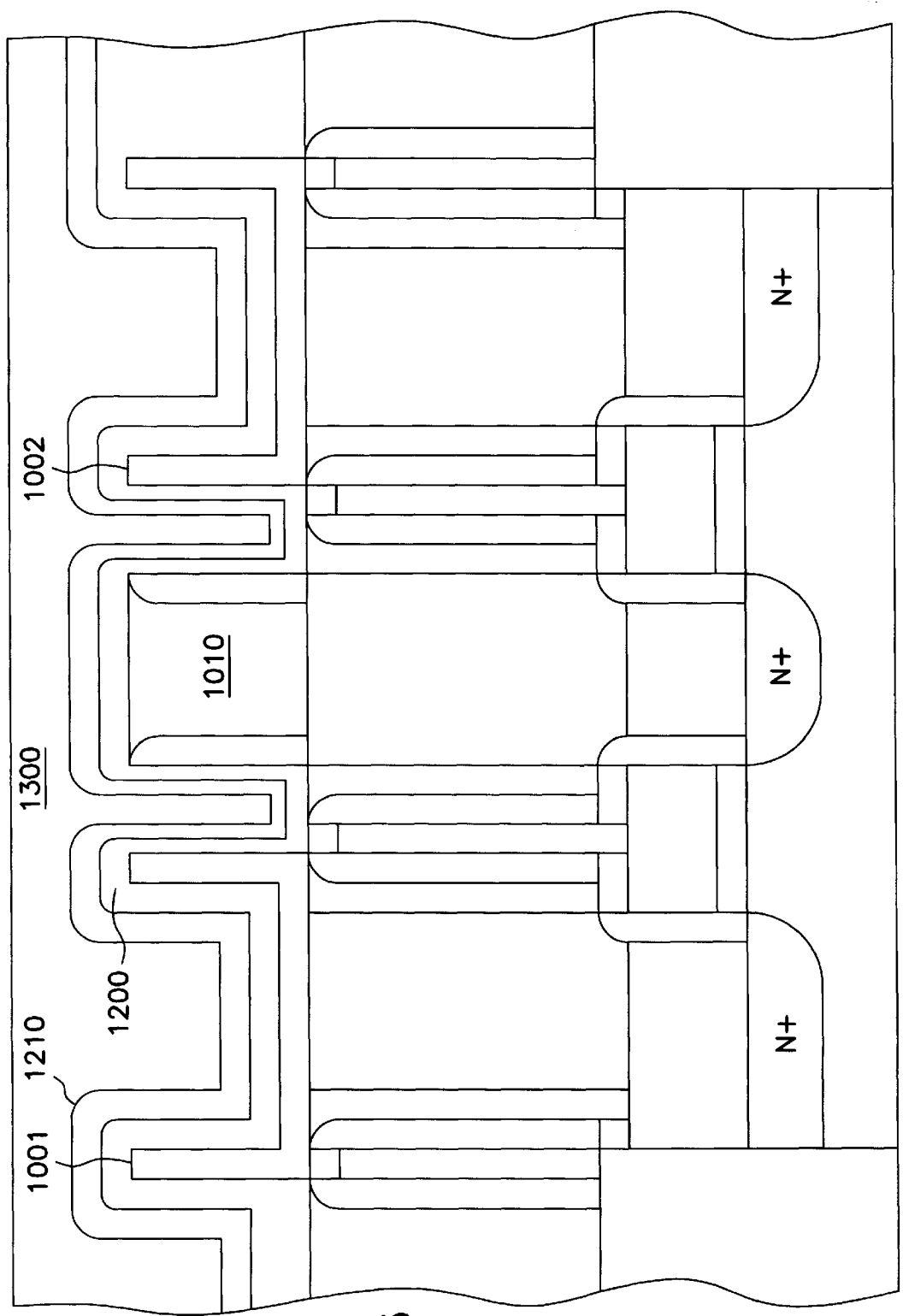

As illustrated in FIG. 15, planarizable insulator 1300, which is any suitable insulator such as $SiO_2$, is deposited after the necessary capacitor materials are formed. The insulator 1300 is planarized such that the surface is sufficiently smooth.

Figure 16:
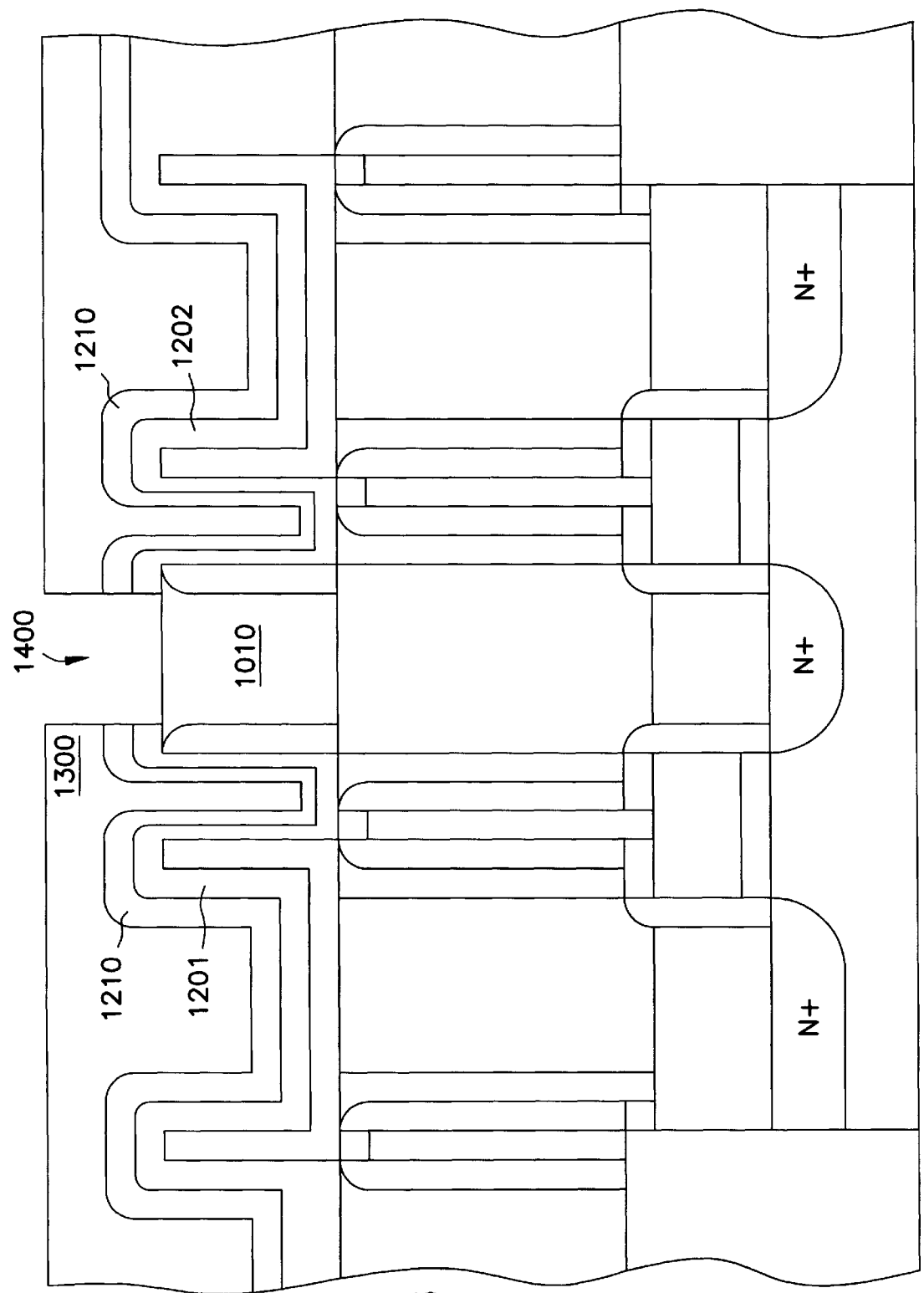

FIG. 16 illustrates a second bit line contact hole 1400 which is formed by applying a conventional contact mask and etching through planarizable insulator 1300, final plate conductor 1210, and through dielectric material 1200. In this manner, second bit line contact hole 1400 exposes bit line contact stud 1010.

Figure 17:
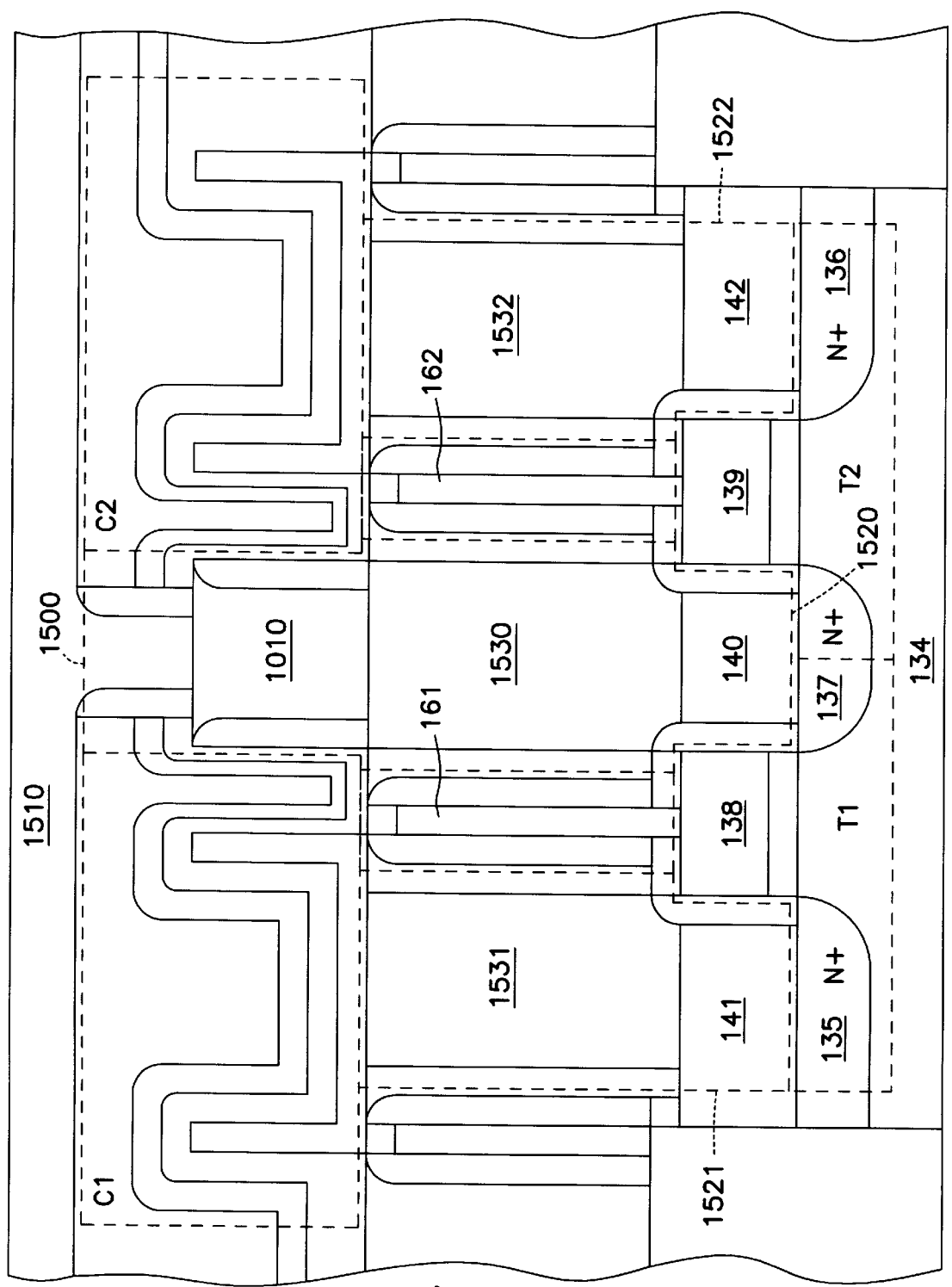

FIG. 17 illustrates the final configuration of the memory device. After forming second bit line contact hole 1400, a conformal insulator such as $SiO_2$ is deposited to create a bit line contact insulating liner 1500. This deposition is followed by an anisotropic etch which removes the recently deposited oxide from the exposed surface of bit line contact stud 1010 but leaves the oxide on the other surfaces. Finally, a metal is deposited and patterned to form bit line metal 1510.

As depicted in FIG. 17, the memory device comprises stacked capacitor C1 and stacked capacitor C2. The stacked capacitors C1 and C2 are accessed by transistors T1 and T2 respectively. Stacked capacitor C1 is coupled to transistor T1 by conductor 1521 which is adjacent to sub-lithographic, edge defined word line 161. Conductor 1521 comprises contact region 141 and doped poly-silicon 1531. Similarly, stacked capacitor C2 is coupled to transistor T2 by conductor 1522 which is adjacent to sub-lithographic, edge defined word line 162. Conductor 1522 comprises contact region 142 and doped poly-silicon 1532.

Retrieving data stored in stacked capacitors C1 and C2 is accomplished by bit line 1520 which comprises doped poly-silicon 1530, contact region 140, bit line contact stud 1010, and bit line metal 1510.

In an alternate embodiment, T1 and T2 may be any semiconductor device suitable for being outwardly formed from substrate 134. For example, in another embodiment, T1 and T2 may be diodes. Similarly, in another embodiment, stacked capacitors C1 and C2 may be any circuit element formed outwardly from word lines 161 and 162 and which is suitable for coupling to the first semiconductor device. For example, in an alternate embodiment, the circuit element may be a resistor, a diode, or a transistor.

Memory Device

Figure 18:
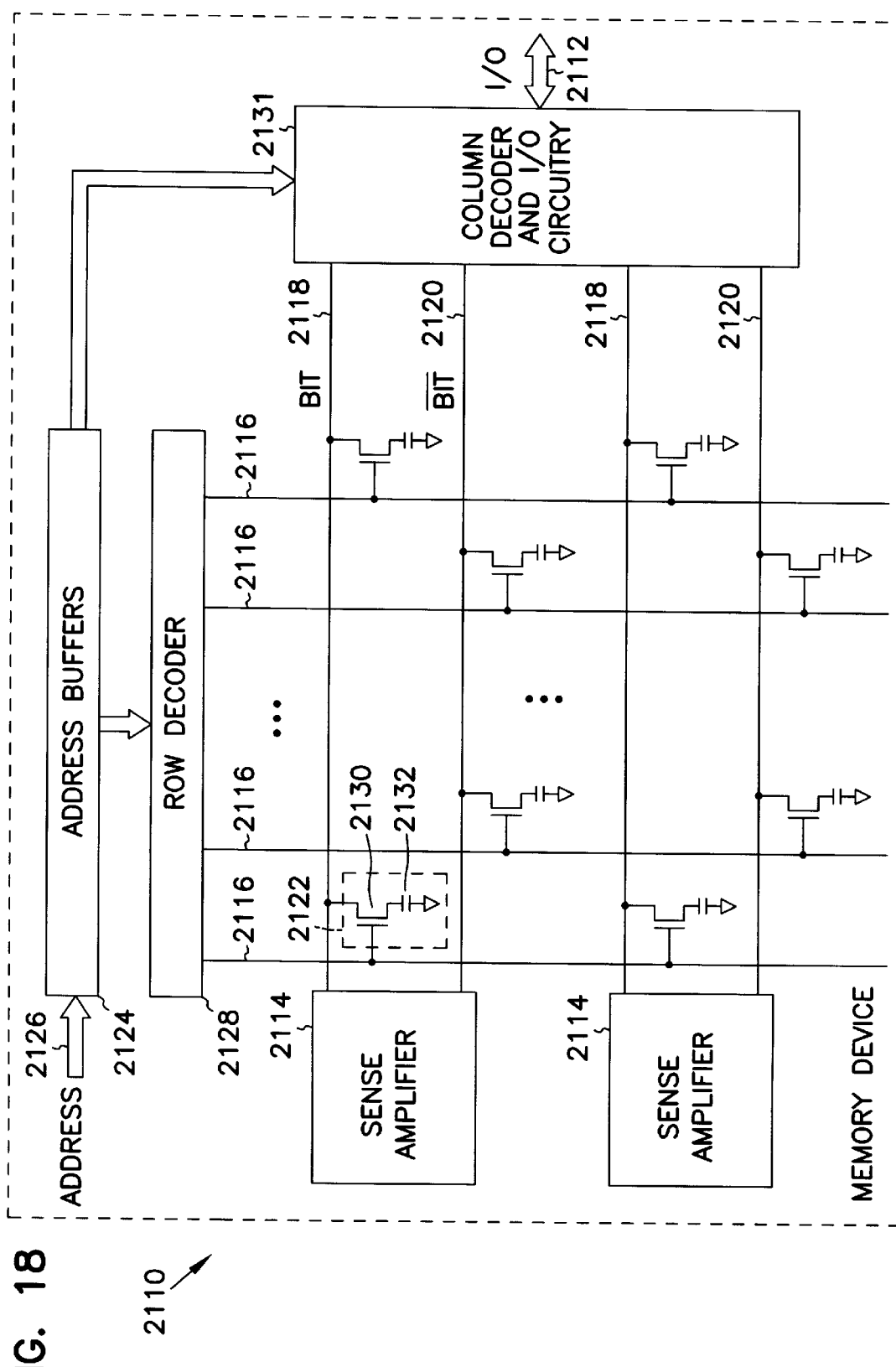
FIG. 18 is a schematic diagram of one embodiment of a memory device according to the teachings of the present invention.

FIG. 18 is a schematic diagram of a memory device, indicated generally at 2110. Memory device 2110 uses dual or folded digit lines to transfer data to and from memory cells via input/output (I/O) port 2112. Memory device 2110 includes word lines 2116, bit lines 2118, and bit complement lines 2120. A memory cell 2122 is coupled to each word line 2116 at the intersection with either a bit line 2118 or a bit complement line 2120. Sense amplifiers 2114 are coupled to a corresponding pair of bit line 2118 and bit complement line 2120. The operation of memory device 2110 is not tied to the folded digit line configuration shown in FIG. 2. Memory device 2110 may, alternatively, use an open digit line or other appropriate configuration for the array of memory cells that can be accessed through sense amplifiers 2114.

Memory device 2110 further includes circuitry that selects a memory cell 2122 from memory device 2110 to receive input or provide output to an external device such as a microprocessor (not shown) at I/O port 2112. Address buffers 2124 receive an address at input port 2126 from the external device. Address buffers 2124 are coupled to row decoder 2128 and column decoder 2131. Column decoder 2131 includes input-output circuitry that is coupled to an external device at I/O port 2112. Row decoder 2128 is coupled to word lines 2116. Column decoder 2131 is coupled to bit lines 2118 and bit complement lines 2120.

In operation, memory device 2110 receives an address of a selected cell at address buffers 2124. Address buffers 2124 identify a word line 2116 of a selected cell 2122 to row decoder 2128. Row decoder 2128 provides a voltage on word line 2116 to activate access transistors 2130 of each cell 2122 of the selected word line 2116. The charge on the capacitor 2132 is coupled to one of the bit lines 2118 or bit complement lines 2120. Sense amplifier 2114 senses a slight difference between the voltage on bit line 2118 and the voltage on bit complement line 2120 of the selected cell 2122 and drives bit line 2118 and bit complement line 2120 to the value of the power supply rails.

Conclusion

The present invention was described in terms of a integrated circuit having a plurality of memory cells comprising two storage capacitors and a shared bit line; however, the method and apparatus are applicable to memory cells having one or more storage capacitors and which have edge-defined word lines. Furthermore, one embodiment has two enhanced n-channel MOS transistors. One skilled in the art will recognize that other types of access transistors can readily be used without departing from the present invention.

The illustrated embodiment coupled a stacked capacitor to an access transistor in an integrated circuit having sub-lithographic, edge-defined word lines. In alternate embodiments, any suitable circuit element may be coupled to any suitable semiconductor device without departing from the scope of the present invention. This application is intended to cover any adaptations or variations of the present invention. Therefore, it is manifestly intended that this invention be limited only by the claims and equivalents thereof.

I claim:

1. A method for forming an integrated circuit using a lithographic process having a minimum lithographic dimension, comprising the steps of:

forming a semiconductor device in a semiconductor substrate;

forming a first conductor outwardly from the semiconductor device, the first conductor having a width less than the minimum lithographic dimension;

forming a second conductor outwardly from the semiconductor device, the second conductor adjacent to and bounded by the first conductor; and coupling a circuit component to the semiconductor device by the second conductor.

2. The method for forming an integrated circuit according to claim 1 wherein the step of coupling a circuit component to the semiconductor comprises the step of coupling a storage capacitor to the semiconductor and wherein the step of forming a semiconductor device comprises the step of forming a transistor for accessing the storage capacitor.

3. The method for forming an integrated circuit according to claim 2 wherein the step of forming a first conductor comprises the step of forming a word line for activating the transistor.

4. The method for forming an integrated circuit according to claim 1 wherein the second conductor is self-aligned with the circuit component by using a single mask image.

5. A method for forming a semiconductor memory device using a lithographic process having a minimum lithographic dimension, comprising the steps of:

forming a transistor in a semiconductor substrate;

forming a word line outwardly from the transistor, the word line having a width less than the minimum lithographic dimension, the word line for activating the transistor;

forming a bit line and a conductor outwardly from the transistor that couple to the transistor, said bit line and said conductor adjacent to the word line; and forming a storage capacitor outwardly from the bit line and the conductor, said storage capacitor coupled to the transistor by the conductor.

6. The method for forming a semiconductor memory device according to claim 5 wherein the conductor and the bit line are bounded by the word line.

7. The method for forming a semiconductor memory device according to claim 5 wherein the bit line is self-aligned with the storage capacitor by using a single mask image.

8. A method for forming two memory cells having a shared bit line using a lithographic process having a minimum lithographic dimension, comprising the steps of:

forming two transistors in a semiconductor substrate, the transistors having a shared drain, each transistor having a gate and a source, the gate extending outwardly from the semiconductor substrate;

forming two word lines outwardly from the transistors, each word line having a width less than the minimum lithographic dimension, one word line connected to a gate of one of the two transistors and one word line connected to the other for activating the transistor;

forming a bit line and two conductors outwardly from the transistors that couple to the transistor, the bit line coupled to the shared drain of the transistors, one conductor coupled to a source of one of the two transistors and one conductor coupled to a source of the other transistor, the bit line and the conductors adjacent to the word line; and forming two storage capacitors outwardly from the bit line and the conductors, one storage capacitor coupled to a source of one of the two transistors by one of the conductors and one storage capacitor coupled to a source of the other transistor by the other conductor.

9. The method for forming two memory cells having a shared bit line according to claim 8 wherein the conductors and the bit line are bounded by the word lines.

10. The method for forming two memory cells having a shared bit line according to claim 8 wherein the bit line is self-aligned with the storage capacitor by using a single mask image.

* * * * *

UNITED STATES PATENT AND TRADEMARK OFFICE
CERTIFICATE OF CORRECTION

PATENT NO.   : 6,190,960 B1
DATED        : February 20, 2001
INVENTOR(S)  : Wendell P. Noble It is certified that error appears in the above-identified patent and that said Letters Patent is hereby corrected as shown below:

Column 1,
Line 65, delete "capacitor" and insert -- capacitors --, therefor.

Column 3,
Line 22, insert -- of -- between "each" and "the".
Line 35, insert -- to -- between "coupled" and "a source".
Line 54, insert -- to -- between "coupled" and "a source".

Column 7,
Line 14, delete "atop" and insert -- a top --, therefor.

Column 8,
Line 25, delete "paths" and insert -- path --, therefor.

Column 11,
Line 5, delete "of a" and insert -- of an --, therefor.

Signed and Sealed this

Sixteenth Day of October, 2001

Attest:

NICHOLAS P. GODICI
*Attesting Officer*   *Acting Director of the United States Patent and Trademark Office*